United States Patent [19]

Westfall

[11] Patent Number: 5,215,631
[45] Date of Patent: * Jun. 1, 1993

[54] ELECTROLYTIC PREPARATION OF TIN, OTHER METALS, ALLOYS AND COMPOUNDS

[75] Inventor: Richard M. Westfall, Denver, Colo.

[73] Assignee: Cel Systems Corporation, Arvada, Colo.

[*] Notice: The portion of the term of this patent subsequent to Dec. 30, 2003 has been disclaimed.

[21] Appl. No.: 775,270

[22] Filed: Oct. 11, 1991

Related U.S. Application Data

[63] Continuation-in-part of Ser. No. 514,192, Apr. 25, 1990, abandoned, which is a continuation-in-part of Ser. No. 345,724, May 1, 1989, abandoned, which is a continuation of Ser. No. 946,694, Dec. 24, 1986, Pat. No. 4,826,579, which is a continuation-in-part of Ser. No. 736,465, May 21, 1985, Pat. No. 4,632,736, which is a continuation of Ser. No. 391,982, Jun. 25, 1982, abandoned.

[51] Int. Cl.⁵ .......................... C25C 3/00; C25C 3/26; C30B 13/18
[52] U.S. Cl. .................................... 204/64 R; 156/600
[58] Field of Search ...................... 156/600; 204/64 R; 205/111, 112, 157, 230

[56] References Cited

U.S. PATENT DOCUMENTS

| | | | |
|---|---|---|---|
| 3,983,012 | 9/1976 | Cohen | 204/64 R |
| 4,632,736 | 12/1986 | Westfall | 204/59 M |
| 4,826,579 | 5/1989 | Westfall | 156/600 |

*Primary Examiner*—John Niebling
*Assistant Examiner*—Brian M. Bolam
*Attorney, Agent, or Firm*—Jay K. Malkin

[57] ABSTRACT

Electrolytic processes for the growth of crystalline tin or other elemental crystals, with or without the use of a substrate. Exemplified cubic forms of alpha-tin and tetragonal forms of beta-tin are grown using a shaped anode and a pointed cathode to provide electrical geometric fields within an electrodeposition system to enhance the growth of the desired crystalline tin.

17 Claims, 3 Drawing Sheets

ELECTROLYTIC PREPARATION OF TIN, OTHER METALS, ALLOYS AND COMPOUNDS

CROSS REFERENCE TO RELATED APPLICATIONS

This application is a continuation-in-part of copending patent application Ser. No. 514,192 filed Apr. 25, 1990, which is a continuation-in-part of Ser. No. 345,724 filed May 1, 1989 (now abandoned) which is a continuation of Ser. No. 946,694 filed Dec. 24, 1986 (now U.S. Pat. No. 4,826,579) which is a continuation-in-part of Ser. No. 736,465, filed May 21, 1985, (now U.S. Pat. No. 4,632,736) which is a continuation of patent application Ser. No. 391,982, filed June 25, 1982 (now abandoned).

BACKGROUND OF THE INVENTION

1. Field of the Invention

The present invention relates to the electrodeposition of free-standing single crystal and free-standing dendritic crystal tin, doped tin and other free-standing single crystals, free-standing dendritic crystals and coatings by electrolysis from electrolytic baths containing tin cations or other ions to be electrodeposited.

The invention also relates to the use of the resulting single crystalline and dendritic crystalline material, for example, as infrared detectors or as a substrate for epitaxial growth of certain semiconductors, and to the use of the resulting systems as, for example, photovoltaic cells or infrared detectors. Electrodeposition of semiconductor materials such as CdTe or HgTe or III-V compounds on the tin or other crystalline material is also taught. Crystalline materials grown using the techniques of the present invention can also be used as standards for X-ray systems calibration, as radiation detectors and for other scientific purposes.

Palladium, titanium and other metal crystals grown using the processes taught in the present invention have use in "cold fusion" research.

Electrodeposition of free-standing single crystalline, free-standing dendritic crystalline, single crystalline coatings, and polycrystalline coatings of superconductor materials such as Nb-Ti, Nb3Sn, Nb3Ge, YBaCuO, BiSrCaCuO, and TlBaCaCuO is also taught.

2. Description of the Prior Art

The electrodeposition of polycrystalline tin and doped tin as well as other metals is now broadly known in the art. Many standard tin and other aqueous plating baths, for example, both acid and alkaline, with or without various additives, have been employed to achieve results such as brightening, leveling, adhesion to the cathode, as well as other objectives. When such additives are used they often tend to insure that the tin and other deposits are polycrystalline, and thus flat or bright, rather than crystalline and visibly faceted. The electrodeposition of tin and other materials from molten salts is known in the art. In substantially each and every one of these prior art tin and other electrodeposition processes, the tin or other material has been deposited as a coating directly onto a cathodic substrate rather than as a free-standing crystalline form as in the present invention. This has also often resulted in the production of tin or other material that is polycrystalline, and that includes, in both an "electrical" and "crystallographic" sense, voids, misalignments, and discontinuities can render the tin or other material inefficient for use as an oriented substrate capable of supporting epitaxial deposition of materials, as an electrical contact, as a cold fusion crystal, as a crystal for calibration or as a crystal for other scientific purpose. Cohen (U.S. Pat. No. 3,983,012) teaches the epitaxial growth of crystalline silicon and germanium by electrodeposition from molten salts, which differs from the present disclosure in that silicon and germanium are produced as free-standing single crystals or free-standing dendritic crystals in the present invention.

Tin has been one of several conductive metals which has been used with semiconductive materials. Polycrystalline tin and other polycrystalline materials are not suitable as surfaces to promote epitaxial depositions of single crystalline coatings or oriented crystalline coatings. Polycrystalline coatings do not support epitaxial depositions of semiconductor thin-films due to discontinuous surface morphology, voids, and crystalline misalignments.

Alpha-tin has been prepared in the past by at least two techniques: the first involves the crystallization of tin from a liquid mercury solvent, and the second involves the vacuum epitaxy of tin onto single crystalline substrates.

Electrodeposition of various semiconductor materials, such as HgTe or CdTe, has been attempted and reported in the past. However, due to the substantial differences among the reduction potentials of Hg, Cd, and Te, the ability to deposit stoichiometric HgTe, CdTe, or ternary mixture compounds is limited. The ability to electrodeposit stoichiometric HgTe on single crystal cubic tin has not been previously reported. Electrodeposition of the III-V semiconductors has been reported in the prior art. Due to substantial differences among the reduction potentials of Al, Ga, In, Tl, P, As and Sb, the ability to deposit stoichiometric III-V materials is limited.

Pd and Ti have been reported to be useful in cold fusion research as cold fusion electrodes. In the case of Pons and Fleischmans and others work, it is noted that single crystal Pd appears to support fusion. Pd crystals used in Pons and Fleishmans' work were produced through zone refining or other melt technique, with preparation to shape and size done through EDM (Electrical Discharge Machining) or other machining technique capable of preserving the crystalline integrity of the electrode. It has been observed that Pd electrodes which have been cold-worked or otherwise work-hardened, do not support cold fusion. Both aqueous and molten salt electrolytic baths to produce Pd crystals are taught in the present invention. Molten salt electrolytic baths are taught in the present invention to produce Ti crystals.

Superconductive materials such as Nb-Ti, Nb3Sn, and Nb3Ge have been produced through various alloying and metal-forming techniques. High-temperature superconductive materials such as YBaCuO, BiSrCaCuO, and TlBaCaCuO have been produced through various aqueous precipitation, sol-gel, reactive evaporation or other technique, but have not been deposited through electrodeposition in the prior art

OBJECTS OF THE INVENTION

Accordingly, it is an object of this invention to provide processes for the electrodeposition of free-standing single crystal tin, free-standing dendritic crystal tin and tin coatings that are substantially free of voids, crystalline misalignments, and discontinuities.

A further object is to provide tin materials that are capable of more functional epitaxial contact with semiconductor materials.

It is an object to provide a process in which single crystal tin so produced can be combined with various semiconductor materials to form a photovoltaic cell or any other device which would benefit from the favorable single crystalline or dendritic crystalline characteristics.

Still another object is to provide processes for the electrodeposition of semiconductor materials, such as Group IIIA (Ga, In)—Group VA (As, Sb) compounds and Group IIB (Zn, Cd, Hg)—Group VIA (Se, Te) compounds, in appropriate stoichiometric proportions, with appropriate doping.

Another object is to provide the use of crystalline tin and crystalline tin-germanium mixed compositions as infrared detector materials.

Yet another object is to provide processes for the electrodeposition of various other metals as free-standing single crystal, as free-standing dendritic crystal and as coatings.

Another object of the present invention is to provide processes for the use of other crystalline materials than tin as substrates capable of supporting the epitaxial growth of semiconductor thin films. Other metal crystals prepared using the processes of this invention can have less lattice mismatch with candidate semiconductor materials and so be better suited to supporting the epitaxial deposition of thin films and the fabrication of devices.

Yet a further object of this invention is to provide processes useful in the preparation of palladium, titanium and other metal crystals having use in cold fusion research and cold fusion reactor manufacture.

Further, another object is to provide processes for the electrodeposition of various superconductors as single crystals, dendritic crystals and as coatings.

Other objects, features, and advantages of this invention will be apparent from the following description, drawings, and examples.

SUMMARY OF THE INVENTION

The process of the present invention incorporates several entirely new and different approaches to the production of free-standing single crystal tin and free-standing dendritic crystal tin with appropriate doping in both the cubic (alpha or gray) and tetragonal (beta or white) forms. This invention teaches the use of the cubic form as a substrate capable of supporting the epitaxial deposition of lattice matching semiconductors such as HgTe and CdTe. The use of cubic tin and cubic tin-germanium compositional mixtures as infrared detector materials is taught in this invention. It provides a simple and economical procedure based on principals that promote self-organization processes to accelerate crystalline growth rates and improve on the degree of perfection of the crystals so produced. It also discloses means for growing free-standing single crystals, free-standing dendritic crystals and coatings of other elements, alloys and compounds than tin. It also provides new procedures for the electrodeposition of compound semiconductor materials in predictable an precise stoichiometric proportions. The invention teaches the preparation of palladium, titanium and other crystals used as cold fusion electrodes. It also discloses procedures for the electrodeposition of superconductive crystals and coatings.

The invention discloses methods of surface preparation which permit the deposition of many different materials as oriented polycrystalline and single crystalline coatings on custom-shaped substrates and mandrels.

This invention permits the production of cubic and tetragonal crystal tin, with both forms being substantially free of voids, misalignments, and discontinuities. Cubic tin's crystalline lattice matches within 1% the crystalline lattice of HgTe, CdTe, and the mixed compound HglCdl-xTe. Epitaxial growth of HgTe, CdTe, and the mixed compound HgxCdl-xTe onto cubic tin yields low strain interfaces and low resistance electrical contacts.

In its simplest form, the process of the present invention comprises the steps of forming a bath containing cations of tin and tin cation solubility supporting anions of at least one or more ionic characters. "Ionic character", as used herein, is determined by the ionic size, ionic shape, electric dipole strength, and ionic charge of an anion. In preferred embodiments, the bath is also substantially saturated with tin cations, as well as having the complementary high concentration of tin cation solubility supporting anions having at least two different ionic characters. The bath is then used by passing current between a counter electrode and a working electrode. The working electrode (cathode for cation reduction and anode for anion oxidation) is where crystal growth occurs, while the counter electrode (anode for cation reduction and cathode for anion oxidation) replenishes the electrolytic solution's concentration of ions of the to-be-deposited material. When the bath is supplied with electric current which passes between the electrodes, the tin cations in the solution are reduced at the cathode as a crystal tin deposit suspended from the tip of the cathode, while tin metal is oxidized to tin cations at the anode.

As already indicated, in preferred embodiments two or more anions of different ionic character are included in the bath. Additionally, in preferred embodiments, the cathode is tin metal or inert material and has its tip sharpened to a fine point, while the anode is of substantially pure metallic tin. Tin metal as a cathode material is preferred in the preparation of tin crystals in order to have acceptable bond strength to support the weight of the growing tin crystal in a gravitational field. In space, a microgravity environment, the weight of the crystal is not a limiting factor, whereas on earth, the weight of the crystal limits the achievable size. The tin sacrificial anode is consumed during electrodeposition and thus replenishes the tin cations in the bath. In preferred embodiments the anod is shaped in such a way that, in conjunction with the cathode, it generates a shaped electrical field. A shaped electric field pattern promotes self-organization processes during the growth of the tin crystal by providing superior tin cation replenishment diffusion patterns, by providing shaped spatial fields and by amplification of the growing crystals local geometric fields. Additionally, such an arrangement provides a system in which the surface area of the sacrificial anode is at least as great as or in the case of cubic tin, much greater than that of the cathode, and so favoring 100% replenishment of tin cations removed from the electrolyte through reduction at the cathode. For example, a V-shaped anode, having its legs separated at an angle nearly comparable to the angle observed for the desired crystalline habit (90 degrees - cubic, 120 degrees - hex, etc.) and with the cathode intersecting its legs, provides an electrical field having a geometry that enhances the growth of crystalline materials. Such an arrangement, in combination with the control of the nucleation and deposition of tin so that it occur only at the tip of the cathode, provides a favorable environment for the embryonic nucleation of seed crystals and the subsequent free-standing growth of the crystalline tin. Furthermore, the use of a pointed cathode substantially minimizes any influences that the crystal structure or epitaxy on the cathode might otherwise exert on the tin during its formation. Additionally, the use of a pointed cathode, in which one crystal dominates, allows adjustment of the configuration of the field which is applied to the crystal while it is being produced, thereby making it possible to provide a field pattern between the cathode and anode that is substantially compatible with the preferred structure of the crystal whose growth is desired. The highest electric field strength between the shaped counter electrode (anode for cathodic deposition, cathode for anodic deposition) and the pointed working electrode (cathode for cathodic deposition, anode for anodic deposition) is at the tip of the pointed working electrode. The high field strength at the tip of the pointed working electrode produces the highest energy flux density either per surface area or by volume. The high flux of energy through the tip of the pointed working electrode results in the amplified self-organizing processes evident in the growth of crystalline materials in the practice of the present invention.

While in the preferred embodiments of the present invention the crystal tin is grown without a supporting substrate, it is possible to produce useful tin as a continuous coating deposited on a cathode.

Many of the conditions under which the process of crystal tin formation is carried out in the present invention are not critical, while others are somewhat more demanding. For example, it may be possible to grow free-standing crystal tin from the tip of any electrode; however, thus far it has been found to be easier to nucleate free-standing crystal tin at the tip of a pointed cathode. In a similar manner, once crystal growth has been initiated, the shape of the anode may not be critical. However, it has been determined that the use of a V-shaped anode having a large surface area enhances the rate of growth of the crystal and helps to provide geometric electric fields that favor uniform crystal nucleation. Tin having good crystalline morphology an integrity is thereby provided by the process of the present invention.

The temperature of the tin bath of the process of the present invention is important in determining the form of tin produced by the process. Baths having temperatures below about 13.2° C. tend to produce cubic alpha-tin. Such cubic crystal tin is thermodynamically stable in the pure form only below about 13.2° C. Baths having temperatures greater than about 13.2° C. favor the production of tetragonal crystal beta-tin. The bath temperature employed may vary somewhat, depending upon other conditions, including the pressure on the system, and by the inclusion of dopant materials in the tin cation containing bath. For example, the use of small amounts of certain dopants, such as Ge, allows the production of cubic alpha-tin alloys at temperatures somewhat in excess of 13.2° C.

Once crystal alpha-tin growth has been initiated at the tip of the cathode, the growth tends to continue at and suspend from the tip of the cathode along a single or multiplicity of twinning planes, a typical twinning plane being substantially an extension of the point of the cathode. Due to the crystal nature of the deposit, it tends to remain in a flat or ribbon shape, although it grows outwardly from the twinning plane as the deposition process continues. Where the process of the present invention uses the geometric fields between a crystal deposited at the pointed working electrode and the V-shaped counter electrode anode, the benefit of such fields may be best continued and maintained by slowly and continuously moving the tin ribbon crystal within the bath as it is formed, so that the leading edge of the crystal (that is, the edge which is farthest from the point of the cathode, closest to the anode) is maintained in a substantially constant position, vis TM a-vis the V-shaped anode. Such positioning, if properly controlled, provides a substantially constant geometric electrical field which enhances uniform nucleation during the growth and shaping of the crystal. Such positioning, if properly controlled, provides favorable ion diffusion paths to sustain ion replenishment and so foster high growth rates with high quality.

Where the process has been used to provide cubic alpha-tin, the resulting crystal ribbon provides an excellent substrate for us with various semiconductor materials. For example, the deposition of HgTe p+semiconductor material, whether by evaporation, electrodeposition, melting, vacuum deposition, sputtering, or other coating techniques, onto the cubic alpha-tin will result in about a 99% or better matching of the crystal structure between the crystalline cubic alpha-tin and the HgTe material. HgTe p+ type material makes useful low resistance electrical contact with the cubic alpha-tin. The low strain and low resistance of the HgTe/alpha-tin heterojunction is important in minimizing the series resistance of the photovoltaic cells disclosed herein. In preferred embodiments, material such as HgTe is electrodeposited, vacuum deposited, chemical vapor deposited or applied by other means on the tin in accordance with the teaching of the present invention. Additionally, the deposition of p-type semiconductor material such as CdTe on the HgTe layer carried by the single crystal cubic alpha-tin, whether by evaporation, electrodeposition, chemical vapor deposition or other processes, results also in a good epitaxial match between the HgTe and CdTe. An n-type large optical bandgap window material is now deposited on the surface of the p-CdTe to form the p/n junction of the device. The large optical bandgap material can be a semiconductor like CdS or ZnSe, a conductive metal oxide like ITO (indium tin oxide), etc.. For materials such as ITO, whose bulk resistivity is such that a low series resistance can be obtained, no spider web-like grid of conductors need be applied to the front surface of the n-type window material. In the case of CdS, ZnSe and many other semiconductors, the bulk resistivity is high enough that a conductive spiderweb-like grid must be applied to the front surface of the n-type window in order to keep series resistance low. The advantage of not having the requirement for the spiderweb-like conductive grid is that the grid cuts down on the optical transmission area and so the amount of current that the device is able to deliver is decreased.

Semiconductor materials of cubic and other space groups can benefit from the oriented crystalline faceted nature of the free-standing crystalline alpha-tin grow using the techniques disclosed herein. Compatibility of the semiconductor layer with the alpha-tin substrate is a function of factors such as: chemical compatibility of the substrate and the semiconductor coating; semiconductor deposition processes compatibility with the substrate; the layers relative work functions; characterization of the junction as to the usefulness of the ohmic, rectifying, injecting or other electrical contact observed; etc.. IIB-VIA semiconductors composed of cadmium and mercury tellurides have lattice constants very near that for alpha-tin.

In order to accommodate cubic semiconductors with smaller lattice constants than the alpha-tin, custom alloys of tin and germanium may be prepared using the techniques taught in this disclosure. By adjusting the composition of the tin-germanium alloy, custom lattice dimension substrates can be tailored.

Active semiconductor devices can be made from the alpha-tin and tin-germanium alloys of the present invention. Infrared detectors can be made with these materials with 0 degrees Kelvin optical bandgaps adjustable in the range of 0.094 eV (alpha-tin) to 0.744 eV (germanium).

Additionally, the process of the present invention can produce crystals for use in cold fusion research and reactor manufacture. Both palladium and titanium can be grown from molten salt bath compositions, and palladium can be deposited from the more common aqueous systems.

Further, the process of the present invention can produce Further, the process of the present invention can produce crystalline materials and coatings of other metals, alloys, compounds or other materials from electrolytic solution systems comprising an electrolyte, ions of the material to be deposited (reducible cations for cathodic depositions or oxidizable anions for anodic depositions), solubility supporting ions (anions for cathodic deposition, cations for anodic deposition), a shaped counter electrode (anode for cathodic deposition or cathode for anodic deposition) and a pointed working electrode (cathode for cathodic deposition or anode for anodic deposition).

Further, the process of the present invention can produce crystalline materials and coatings of superconductive materials in solution systems comprising supporting anions, supporting cations, and cathodically reducible cations of the respective materials so produced in crystal form.

DETAILED DESCRIPTION

In general, growing crystals using the techniques of the present invention involve the use of electrolytic deposition systems to produce free-standing single crystalline materials and free-standing dendritic crystalline materials. The first system to be described is that used in the production of tin crystalline materials.

Figure 1:
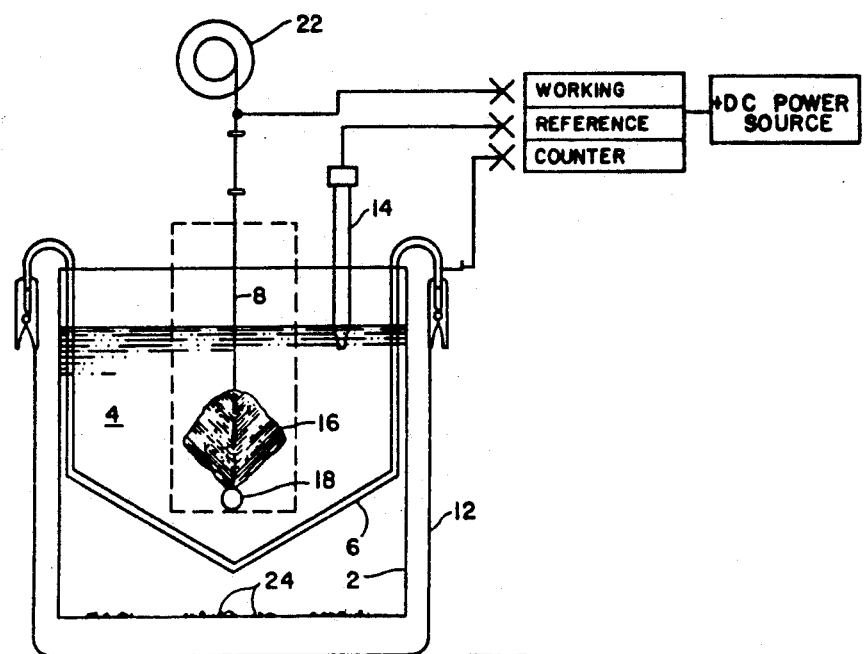
FIG. 1 is a diagrammatic representation of an electroplating system for use in the present invention.

Referring now to FIG. 1, a preferred tin electroplating system is shown which includes container 2 into which bath 4 is placed. Within container 2 is V-shaped anode 6 and pointed cathode 8. Anode 6 and cathode 8 are connected electrically to a source of D.C. electric current (not shown). In preferred embodiments voltage equalization connection 12 is connected between the two legs of anode 6. Additionally, as means for controlling and adjusting the activity of the plating system, reference electrode 14 is operatively inserted into the bath. Potentiostatic power supply means as known in the art can thereby control crystal growth rate as desired by maintaining a constant cathode voltage with respect to the reference electrode and allowing the current to vary. Measurement of the voltage difference between the cathode 8 and the reference electrode 14 is done using a high-impedance sense line as a part of the potentiostatic power supply means. Representative crystal tin deposit 16 is shown suspended from the tip of cathode 8.

In one preferred embodiment of the electroplating system of the present invention, a light source 18 (such as an LED) is aimed at a detector (not shown) and both are located so that the light beam is interrupted when single crystal tin deposit 16 grows to a certain predetermined length. Upon interruption of the light beam to the detector, feedback from the light source detector is provided to operate stepping motor 22 which is mechanically connected to cathode 8, so that cathode 8 and suspended crystal 16 are incrementally lifted. This arrangement provides a substantially constant relationship between the position of the leading edge of crystal 16 and position of the anode 6.

Figures 2A, 2B, 2C, 2D:
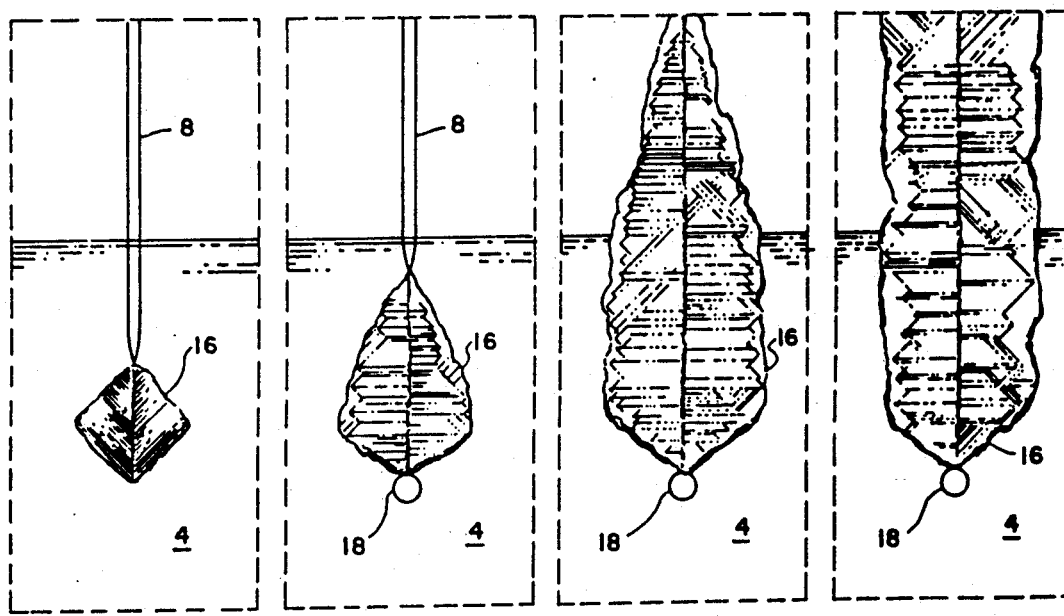
FIGS. 2a-2d represent various stages of crystal alpha-tin growth using the process of the present invention.

An example of free-standing single crystal alpha-tin is shown in FIG. 2a. The square morphology is obtained by operation of the present invention by the electrolytic reduction of tin cations at a cathode 8 maintained potentiostatically at a voltage within region "a" of the I-V curve of FIG. 3.

Referring to FIGS. 2b-2d, various stages of dendritic crystalline ribbon growth are shown. The growth of dendritic crystalline ribbon proceeds in region "b" of the I-V curve of FIG. 3. The morphology shown in FIGS. 2b-2d is indicative of a central twinning plane with many orthogonal (perpendicular) twinning planes along its length. It is seen that each twinning plane ends in an "arrowhead" shape. The occurrence of predetermined morphological characteristics such as are shown in FIG. 2a, and in FIGS. 2b-2d, is seen to correlate with the reduction potential of the cathode used.

While not shown, in preferred embodiments a thermostatic control system is used in conjunction with the plating cell, to control the temperature, for example, above or below about 13.2° C., to provide respectively for either tetragonal crystal beta-tin or cubic crystal alpha-tin.

In preferred embodiments, anode 6 is prepared from substantially pure metallic tin rods. If such tin rods are not available, they can be easily produced from any source of pure metallic tin using, for example, appropriate melting, forming and purification techniques. Purification may involve electrochemical or other processing before melting and forming and (of) may consist of zone refining or other moving liquidus/solidus front techniques. The tin anode, regardless of its shape or location, also serves to purify by substitution and replenish the bath by continuously releasing tin cations during the operation of the electroplating system.

Tin Plating Baths and Plating Processes

Figure 3:
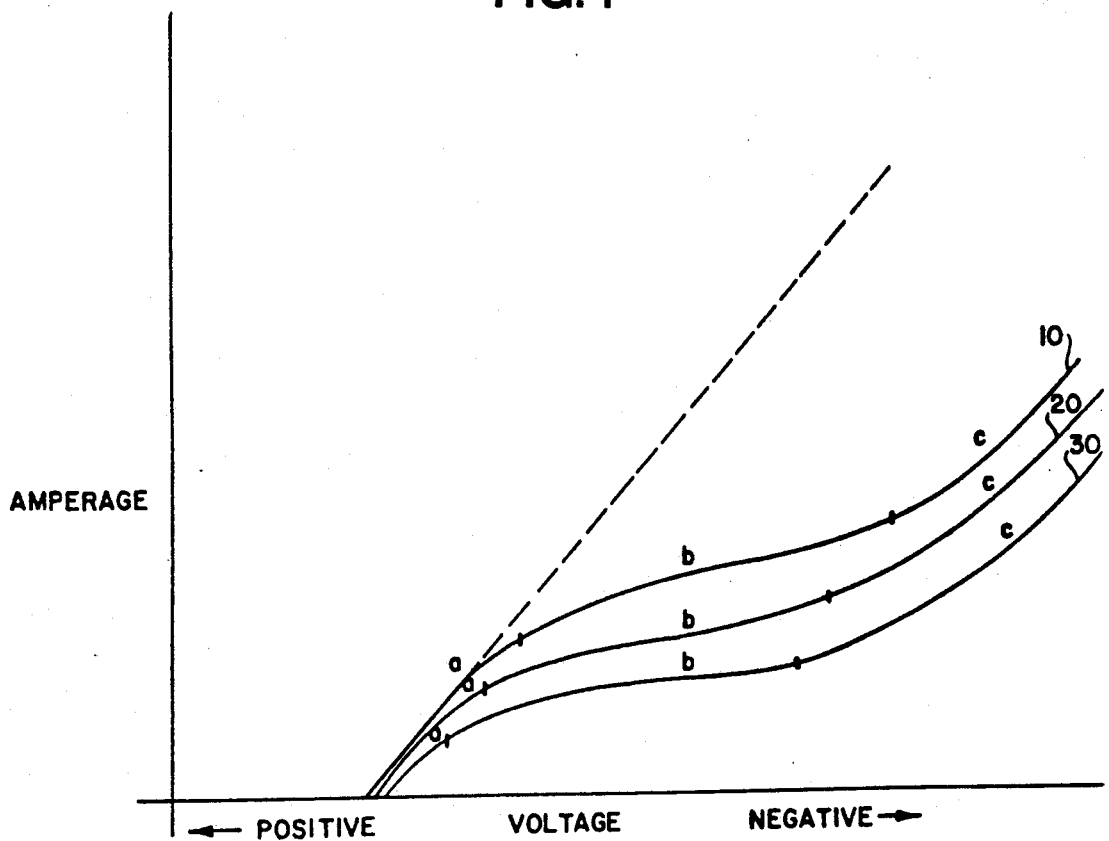

Many forms of tin bath can be used successfully in the practice of the present invention following the operating parameters described herein and with reference to FIG. 3. As explained below, the higher the tin cation concentration, the more efficiently the plating bath will operate. The three curve in the graph of FIG. 3 show the relationship of applied voltage and amperage for a variety of tin cation concentrations. The curve labeled 10 is indicative of the highest, and preferably a saturated, cation concentration, and is further indicative of the electrolyte characteristics in preferred embodiments of the present invention. To model the processes occurring at a working electrodes surface, we use the concept of a Helmholtz double layer. The Helmholtz double layer is in the case of tin deposition on a cathode 8, a layer of positively charged cations sandwiched between the negatively charged cathodic surface and a negatively charged layer made up of the cation solubility supporting anions. The curves labeled 20 and 30, respectively, show less concentrated and less favorable electrolytic characteristics.

For example, one suitable plating bath, substantially corresponding to curve 10 is prepared by providing an acid mixture of 100 ml. each of concentrated $H_2SO_4$, concentrated HCl, and concentrated HBr, to which mixture is added pellets of pure metallic tin. Upon addition of tin metal to the mixture of acids, digestive oxidation of the tin produces vigourous bubbling as a result of the generation of hydrogen gas. Digestive oxidation of tin releases tin cations (stannous $SN+2$) into the forming aqueous electrolyte. The reaction is accelerated by heating, both as a result of the exothermic heat of reaction of the tine with the acids and as a result of the introduction of heat from an external source. Hydrogen bubbling ceases as tin cation concentration becomes near saturation in the aqueous electrolyte. However, after dissolution is complete, the generation of hydrogen will cease. Additional undissolved tin 24 is maintained in the bottom of container 2.

Based on what is understood to be the mechanism of the plating cell, other acids or salts could be used in the cell to produce similar results with the tin cations. Substantially any acid or salt, inorganic or organic, that is stable at the temperatures at which the bath will operate is now believed to be operable in the present process. For example, one or more anions chosen from the group consisting of bromide, chloride, chromate, fluoride, iodide, nitrate, oxalate, selenate, sulfate, and tartrate provide such operability. However, it has been determined that nitrate-producing acids and salts when mixed with halides produce nitrosyl halides which are detrimental to the system and should not be introduced. Additionally, a combination of anions having different ionic character is desired. Anions of different ionic character provide increased polarization, and therefore good conductivity, ion diffusion, and plating activity to the system of the present invention. The use of mixed anions promotes rapid ionic diffusion, replenishment of the Helmholtz double layer with cations, and accelerated rate deposition conditions. Diffusion limitations involving insufficient replenishment of the Helmholtz double layer at the cathodic surface with reducible cations of the to-be-deposited material might otherwise slow reduction and the nucleation process.

After the bath of the present invention has been formed, it is preferably continuously filtered during plating operations. Filtering must not produce turbulent solution conditions in the practice of the present invention. Where it is intended to form tetragonal beta-tin, the bath should be heated above 13.2° C. Where it is intended to form cubic alpha-tin, the bath is temperature controlled below about 13.2° C by use of a thermostatic control system, or other means, not shown.

Figure 4:
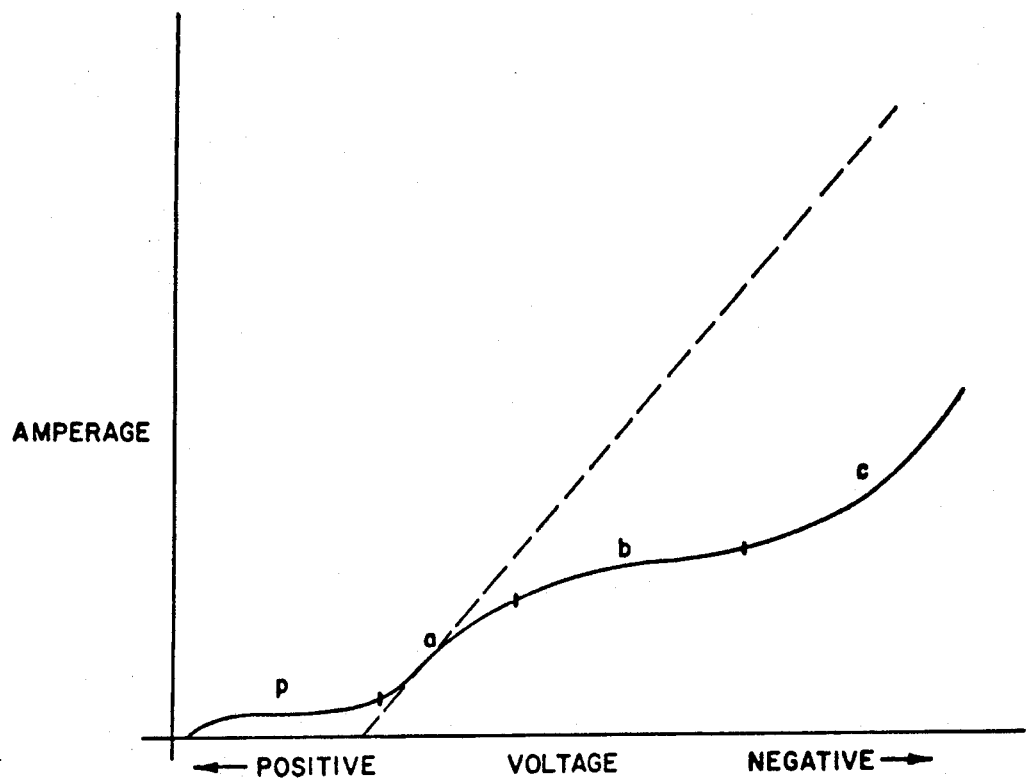
FIGS. 3 and 4 provide graphic data concerning the parameters of the practice of the present invention.

As an initial operation before the start of tin electrodeposition, the bath of the present invention is preferably electropurified. Referring to FIG. 4, electropurification, occurring in regions "p" and a portion of "a" and perhaps "b", is performed by application of a potential across the working electrode (cathode for tin) and the counter electrode (anode) to induce current flow. The applied potential is adjusted to establish a cathodic surface potential vs. a standard reference electrode, slightly below the cathodic surface potential expected to achieve the desired crystalline habit of growth. During this operation, cations in the bath having a more positive reduction potential than the expected cathodic surface potential used in the practice of the present invention are attracted to the cathode, reduced, and thereby removed from the solution. Incidental with the operation of this purification step, the sacrificial high-purity tin anode 6 in FIG. 1, is oxidized to generate additional tin cations which enter the bath to "replace" the impurities and tin cations being reduced and so removed from the solution at the cathodic surface. Referring again to FIG. 4, region "p" of the plating bath's current-voltage curve is indicative of the impurities. Region "a" begins at the reduction potential for tin where the curve is seen to turn sharply upward and corresponds to region "a" on the curves of FIG. 3. The abruptness of this turn-on potential shown in FIG. 4 indicates that the bath has reached a state of substantially complete purification. The time required to complete electropurification will depend on the magnitude of impurities present in the electrolyte, the rate of electropurification current passage, the size of the electrolyte, the agitation of the electrolyte and other factors.

After bath electropurification has been completed, dopants are added to the bath if desired. Dopants, such as Ge, As, and Sb, may be (a) desirable addition(s) to the tin bath to somewhat lessen the temperature sensitivity of the crystals produced by the bath, especially where the tin to be produced is to provide service above 13.2 degrees C. for the cubic material and below 13.2 degrees C. for the tetragonal material. The use of small quantities of dopants of this type, which have larger atomic radii and(or) greater electronegativity than the tin, stabilize the crystal formed by providing atoms in the plated material which pin the slippage planes of the crystal. By pinning the slippage planes, the transition from cubic to tetragonal tin at temperatures above 13.2° C. is hindered. In addition to providing pinning, Ge further decreases temperature sensitivity because it has a higher electronegativity and has no tetragonal form; it increases the stability of cubic tin. Germanium is soluble in aqueous solutions in the presence of fluoride $(F-)$ anions and in many molten salt electrolytes. The tin-germanium alloys are produced using electrolytes which are aggressive enough to have the ability to oxidize a germanium containing anode to replenish the bath with germanium cations. In addition to the dopants mentioned, any other dopant having an atomic radius greater than that of tin, as well as an electronegativity greater than that of the tin, may be used to serve the function of reducing the temperature sensitivity of the deposited tin material to crystalline phase transformations.

After the plating system of the present invention has been thus prepared, cathode 8 is preferably lowered into the bath so that the tip of the pointed cathode 8 is immersed in bath 4 to the extent of from about 2 mm to about 6 mm of its length. Cathode 8 is connected to the negative pole or working electrode connection of the D.C. power source. Anode 6 will have been previously placed into container 2 and connected to the positive pole or counter electrode connection of the D.C. power source. With the cell so connected and operating with current flowing through the bath between electrodes 6 and 8, when the cathodic surface potential at cathode 8 is in the approximate range of between about (neg.)−0.13 and (neg.)−0.8 volts versus hydrogen, a cluster of tin crystals will nucleate and begin to grow out into the solution from the tip of the pointed cathode 8 and toward the anode 6. Next, one tin crystal seed is chosen from the cluster for further growth and maturation. To isolate the chosen one all other crystal seeds are pruned from the tip of the pointed cathode. After the growth of a crystal is begun, the applied potential is increased or decreased to a predetermined amount, thus encouraging only the formation and growth of the desired crystal morphology. The greater the applied potential between the anode and the cathode, the more negative the cathodic voltage is driven, the faster tin crystal 16 grows, and the more it tends to grow in the ribbon or leaf-type structure, as opposed to cubic squares.

After crystal growth has been initiated at cathode 8, if more than one tin crystal is found to be growing at the cathode, then all tin crystals but one can be and should be mechanically removed from the cathode. This avoids crystal growth competition between multiple crystals.

Referring again to FIG. 3 and the representative crystals shown in FIGS. 2a–2d, the growth mechanism of the tin crystals can be understood by referring to the amperage vs. voltage curve shown therein. As shown by the curve of FIG. 3, there are three distinct types of growth, depending upon the relationship between the amperage and the voltage of the plating system. In region "a", the I-V curve implies nearly ohmic behavior, evidencing that ion diffusion rates and the thickness of the Helmholtz double layer at the working electrode are not limiting current flow. Tin electrolytic deposition carried on in region "a" of the I-V curve produces the type of crystal shown at FIG. 2a. Primary nucleation of the crystal is the dominating mechanism controlling growth in region "a". In region "b", the I-V curve evidences the increasingly diffusion limited replenishment of reducible cations in the Helmholtz double layer on the cathodic surface where crystal growth occurs. In region "b" crystal growth is greatly influenced by secondary nucleation related defect inclusion and produces the type of ribbon-like dendritic crystals shown in FIGS. 2b–2d. Both primary nucleation (associated with ordered growth) and secondary nucleation (associated with disordered formation mechanisms are underway in region "b" of the I-V curve. In region "c" of the I-V curve the Helmholtz double layer has become unstable, turbulent and incapable of supporting primary nucleation on the cathodic surface. Secondary nucleation is believed to be dominant in region "c". The break in the curve between regions "b" and "c" is indicative of a phenomenon known as "double layer breakdown". This phenomenon is caused by the presence of a "critical overpotential" in which the accumulation of anions and cations forming a double layer of space charge at the cathode is made turbulent and ill-defined. When various influences together disrupt primary nucleation processes on the working electrodes surface to the point where secondary nucleation processes become dominant, we define this as critical overpotential. As the Helmholtz double layer increases in thickness due to the increased current per area used to grow crystals faster, the ability of reducible cations to diffuse through the anionic layer is reduced. As the growth rate is increased, the rate of deposition of reducible cations at the cathode goes up, and so the thickness of the cation containing layer on the surface of the cathode decreases, resulting in the negatively charged anion containing layer coming closer to the negatively charged cathodic surface, resulting in greater like charge repulsive forces between the anion containing layer and the cathodic surface inducing turbulence and the ultimate breakdown of the Helmholtz double layer.

Referring again to FIG. 3, some noteworthy trends are shown for plating baths of various concentrations. The intercepts of the voltage axis indicate relative reduction potentials, which are seen to be increasingly negative with lessening concentrations of stannous (Sn+2) cations. The durations of regions "a" and "b" are seen to decrease with lessening concentrations. Thus, the most favorable nucleation environment with the broadest operating envelope is seen to exist for curve 10 or other comparable high tin cation concentration solutions.

The dashed line shown in both FIGS. 3 and 4 indicates the purely resistive or ohnmic amperage-voltage curve for an ideal constant resistance tin cation plating system. Region "a" of each curve falls on or close to this line, with region "b" beginning where ion diffusion limitations constrict the reducible cation replenishment rate at the cathode, becoming less than the cation reduction rate at the cathodic surface. As the rate of cation reduction the cathodes surface exceeds the cation replenishment rate, the layer of cations decreases in thickness and the like-charge repulsive forces between the anion containing layer and the cathodic surface become very large. Turbulence intensifies, and when either the anion containing layer or the bulk solution touch the cathodic surface, the growth of crystalline material ceases. Coatings applied at voltages beyond the critical overpotential, in region "c" of the I-V curve are likely to contain void and be composed of nonoriented microcrystallites or be amorphous.

Where the crystal alpha-tin produced by the present invention is intended for use in semiconductor to produce cubic squares, or dendritic ribbons. When grown slowly in region "a", a square crystalline morphology results. When grown quickly, for example, under the conditions of region "b" of FIG. 4, dendritic ribbon is produced. Dendritic crystalline alpha-tin appears as a series of diagonally oriented overlapping closely spaced squares. The I-V curve which shows regions "a", "b" and "c" is encountered with single element electrolytic deposition systems involving elements other than tin. Helmholtz double layer concepts apply to systems operable in the present invention. The solvent electrolytes used are in preferred embodiments, aggressive enough to digest a sacrificial counter electrode as needed to replenish the electrolyte of depositable ionic species. Solvent electrolytes which are not aggressive enough to digest sacrificial counter electrodes are operable with another source of replenishing ions to maintain steady state concentrations of the various ionic species encountered.

After the predetermined production of cubic crystals or other forms of crystal tin according to the present invention, the tin crystal 16 is removed from the cell and, if necessary, trimmed by EDM (electrical discharge machining) or other suitable method to the desired size and shape required for its subsequent use. The surface of the cubic alpha-tin is not flat, but faceted. The natural faceting is promoted by the amplified self-organizing influence of the flux of energy through the growing crystal exerts during nucleation and growth. The faceted surface of the alpha-tin crystalline material provides reflection reducing multiple bounce light paths, lending itself to photovoltaic device use.

PHOTOVOLTAIC CELL

Before proceeding with the description of the various exemplary embodiments of the invention, the underlying concept will be first described.

In general, photovoltaic cells, according to the present invention, comprise a low-resistance front contact on a layer of CdS, ZnSe ITO or other n-type large optical bandgap material in surface contact and forming an n/p junction with a photon absorbing p-type semiconductor layer such as CdTe. The CdTe is in surface contact with the degeneratively-doped p+-type semimetal HgTe, on crystalline alpha-tin or other suitable low-resistance substrate. The sandwiching of HgTe/CdTe/n-type window material, creates a photovoltaic device. The p/n junction formed by application of the n-type window material on the p-type CdTe is the active photovoltaic conversion region of the device. This structure is of the p+/p/n type, and the mechanism of photovoltaic generation involves the formation of electron hole pairs in the CdTe layer in response to the action of incident illumination. The photogenerated minority charge carriers diffuse or drift across the junction, from the p-type CdTe layer into the n-type layer, thus creating a potential difference, which in turn causes an electric current to flow in a external circuit connected by suitable electrical contacts to either side of the semiconductor sandwich. Similarly, a HgTe layer in contact with the CdTe provides a back surface field in the CdTe layer capable of sweeping photogenerated minority carriers away from the back contact, toward the p/n junction to be collected and provide current to an external circuit. Crystal alpha-tin in contact with the HgTe layer provides a low-resistance back contact. Cubic alpha-tin is a favorable surface for epitaxial nucleation of the HgTe. The n-type window material on the p-type CdTe produces a space-charged layer in the front of the CdTe, causing the migration of photogenerated carriers in the CdTe toward and across the junction to the n-type window material. This combination of properties should enhance the overall efficiency of such a photovoltaic cell.

As previously noted, many types of semiconductor devices can be produced using the crystal alpha-tin produced by the process of the present invention as an electrode. Examples of two photovoltaic cells using crystal cubic alpha-tin are now set forth.

Figure 5:
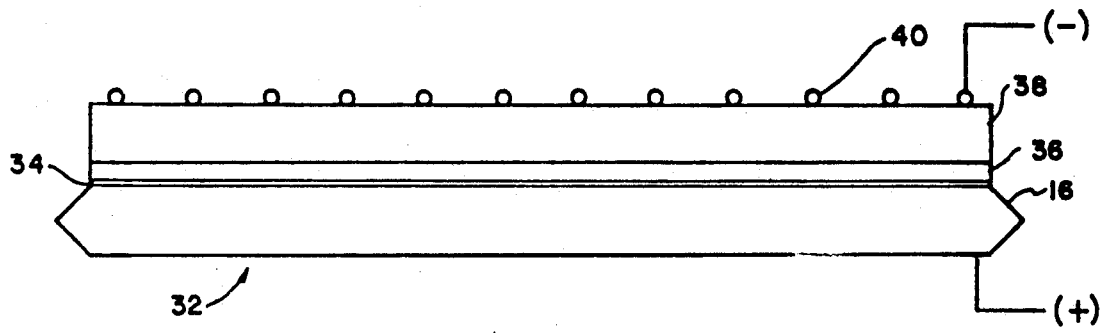
FIG. 5 is a plan view of a photovoltaic cell made according to the present invention, which includes a single crystal cubic alpha-tin substrate material produced by the process of the present invention.

The photovoltaic cell shown in FIG. 5 is generally a structure including crystal cubic alpha-tin 16; HgTe 34; CdTe 36. In the photovoltaic cell shown, many different n-type large optical bandgap window materials can be coated onto the CdTe 36 of the three layer structure. In one form of photovoltaic cell, the photovoltaic material in fourth layer 38 can be CdS, while in another form of photovoltaic cell, the layer 38 of large optical bandgap n-type window material can be ZnSe while in yet other forms of photovoltaic cell, the layer 38 can be ITO (indium tin oxide) or other large optical bandgap n-type window material. To fourth layer 38 contact grid 40 is applied.

In the production of each of these photovoltaic cells, the crystal cubic alpha-tin 16 is used as a crystalline substrate for the epitaxial growth of HgTe 34. In a similar manner, HgTe layer 34, once deposited, is then used as an epitaxial surface for the deposition of CdTe layer 36. The HgTe layer 34 may be provided by electrodeposition, vacuum deposition, sputtering, chemical vapor deposition or other suitable coating techniques. In preferred embodiments care will be taken to assure that the sources of HgTe, CdTe and n-type materials are each of appropriate stoichiometry, each having their own appropriate electronic and optical properties. In a similar manner, the CdTe layer 36 may be deposited on the HgTe layer 34 by electrodeposition, vacuum deposition, sputtering, chemical vapor deposition or other means.

Where fourth layer 38 is CdS, it is deposited by vacuum deposition, sputtering, chemical vapor deposition or other suitable means on CdTe layer 36. However, where the fourth layer 38 is ZnSe, it may be deposited by electrodeposition, vacuum deposition, sputtering, chemical vapor deposition or by other suitable means onto CdTe layer 36. Where the fourth layer 38 is ITO (indium tin oxide), it is deposited by sputtering or other suitable means on CdTe layer 36.

The p+-type HgTe layer 34 is closely lattice-matched to both the alpha-tin substrate layer 16 and the p-type CdTe layer 36 resulting in a low-strain structure. The p+-type HgTe layer 34 provides a back surface field in the p-type CdTe layer 36, close to the P+-type HgTe interface, at the back of the active region of cell 32. This will provide a greater internal quantum efficiency as well as greater electric current production in the cell when exposed to light.

In the operation of the photovoltaic cell 32 of FIG. 5, CdTe layer 36 serves as the principal radiation absorbing layer and the sweeping of photogenerated minority carriers away from the p+-HgTe layer 34 through the p-type CdTe layer 36 and across the junction into the n-type window material fourth layer 38 produces all of the power developed by the cell. CdS or ZnSe or other large optical bandgap n-type material layer 38 serves to provide a space charged region in front of CdTe layer 36 providing photogenerated current collection. Layer 38, whether CdS or ZnSe, or other large optical bandgap n-type material provides current collection for the photogenerated carriers produced in the CdTe layer by radiation. Various dopants may be used in each of the layers of photovoltaic cell 32. Dopants for the p+-type HgTe layer 34 and the p-type CdTe layer 36 are those from groups IB (Cu, Ag, Au) and VA (P, As, Sb). Dopants for the n-type II-VI compounds CdS and ZnSe ar those from groups IIIA (Al, Ga, In) and VIIA (F, Cl, Br, I). Other semiconductor materials as desired or required may be used.

It has been calculated that the photovoltaic cell in which CdS is fourth layer 38 will produce maximum theoretical efficiency of about 21% conversion of the standard or AM1 illumination, while the photovoltaic cell in which the ZnSe is fourth layer 38 will produce about 23% theoretical efficiency. Alpha-tin 16, HgTe 34, and CdTe 36 are all cubic with lattice constants which differ by less than 1%. Close lattice match of these three layers is important in the epitaxial deposition of the HgTe 34 onto alpha-Sn 16 and in the epitaxial deposition of CdTe 36 onto HgTe 34. Low strain interfaces in this closely lattice-matched sandwich of materials also reduces the recombination velocities at the interfaces, and so lengthens the photogenerated carriers lifetimes and diffusion lengths and ultimately benefits the internal quantum efficiency of the device. Lattices of both CdS and ZnSe as layer 38 differ from that of CdTe layer 36, on which they are coated. Despite lattice mismatch, the oriented crystalline nature of the third layer CdTe 36 favorably influences and orients the growth of fourth layer 38 producing a p/n junction with appropriate electrical characteristics.

In operation, photovoltaic cell 32 will produce d.c. voltage and current. This occurs when light from any source passes through front contact 40 through n-type layer 38 and into p-type CdTe layer 36 of cell 32. Photons that are not absorbed by layer 38 and that are not reflected from it are either absorbed by or reflected from CdTe layer 36. Photons having energy above the bandgap of the material in layer 38 (either the CdS or ZnSe or other n-type material) will be either absorbed or reflected by this n-type semiconductor layer. The remaining photons, those having energy below the band gap of the material of layer 38 but above the band gap of CdTe layer 36, will be absorbed or reflected by CdTe layer 36. Controlling the electrical properties of CdTe layer 36, HgTe layer 34, and fourth layer 38 causes CdTe layer 36 to have space charge regions at both of its ends. This is achieved by maintaining CdTe layer 36 at a higher resistivity and a lower carrier density than either HgTe layer 34 or the n-type material of layer 38. This will thus cause the resistivity of CdTe layer 36 to be greater than the resistivity of either the HgTe layer 34 or of the CdS or ZnSe or other n-type layer 38. Therefore, a space charge region is induced to exist throughout CdTe absorbing layer 36 with the result that layer 36 possesses a highly efficient form of internal electric field for maximum internal quantum efficiency.

ELECTROLYTIC PRODUCTION OF HgTe

As has been noted, when it is desired to use HgTe as a p+-type semiconductor material associated with the crystalline cubic alpha-tin produced according to one teaching of the present invention, it may be produced by electroplating, vacuum deposition, sputtering, chemical vapor deposition or other known means. Tin has a low melting temperature of near 232 degrees C., with unstabilized alpha-tin converting to the beta phase above 13.2 degrees C. Processes to deposit HgTe 34 onto alpha-tin 16 must not excessively heat the alpha-tin substrate 16, in order to avoid the unwanted phase transition to the beta form or other degradation of the alpha-tin substrate 16.

One preferred non-heating technique for the preparation of HgTe is by electrodeposition. Stoichiometric HgTe has been difficult to produce using known prior art electrodeposition techniques a the reduction potential of reducible Hg cations is more positive than the reduction potential of reducible Te cations. In a bath with comparable activities of both Hg cations and Te cations, Hg will preferentially deposit and yield a deposit (Hg)n(Te)x, where n>x.

Additionally, both reducible Hg cations and reducible Te cations have reduction potentials significantly more positive than tin cations, requiring the introduction of the tin substrate into the electrolyte under potentiostatically controlled cathodic protection to avoid oxidative corrosion of the tin substrate by the Hg and Te cations.

It has now been determined that stoichiometric HgTe may be produced by electrodeposition by controlling concentrations of the Hg cations and Te cations. By the use of a relatively insoluble source of Hg cation, such as HgO or HgI in the presence of additional I anions, and a highly soluble source of Te cation, electrodeposition of stoichiometric HgTe may be achieved. For example, a bath including Te metal, $TeO_2$, $TeI_4$, $HgI_2$ or HgO, concentrated $H_2SO_4$ and HI will provide a large ratio of Te cations to Hg cations. At a plating potential in the range of about (pos.)0.6 V to about 0.0 V versus hydrogen, stoichiometric HgTe may be produced from this bath.

The electrodeposition of HgTe on one surface of cubic single crystal alpha-tin produced in accordance with the present invention requires that the tin be clean and oxidation free, coated on the back surface with a dielectric or negative photoresist-type material, and made the cathode in a plating system. The tin substrate is susceptible to the corrosive nature of this bath and must be introduced into the bath under cathodic protection afforded through the potentiostatic control of the surface potential of the tin substrate at voltages negative enough to protect the tin substrate from oxidation. The pH of the bath will be acid, in a range of from 0 to about 3.0. In preferred practice a reference electrode will be used with the system to control the cathodic surface potential. When HgTe is epitaxially electrodeposited directly on single crystal cubic alpha-tin, the HgTe deposit is also single crystal, the lattice match with the tin will be about 99%, and the epitaxial match and electrical contact will be sufficient to achieve the described advantages of the present invention.

ELECTROLYTIC PRODUCTION OF CdTe

As with HgTe, the electrodeposition of CdTe is one nonheating technique for deposition of CdTe onto the alphatin/HgTe substrate. The reduction potential of reducible Te cations is much greater than the reduction potential of reducible Cd cations, dictating the use of an electrolyte saturated with Cd cations and only trace quantities of Te cations. In a electrolyte where the Te cation concentration is too high, stoichiometric CdTe will not be produced; rather, the result will be $CdTe_n$, where n is a large integer. It has now been discovered that the production of stoichiometric CdTe is favored, in acid solutions, by the use of concentrations of Cd cations that are about at least $10^4$ to about $10^7$ times greater than the concentrations of Te cations. Cadmium salts useable in aqueous electrolytes are the sulfate, chlorate, nitrate, and halides. Mixtures of nitrates and halides are to be avoided due to nitrosyl halide formation. Cadmium chlorate solubility can reach the equivalent of 35 molar, which is the highest solubility of all the cadmium salts. Handling chlorates must be with caution as explosives can be formed unintentionally. The tellurium is introduced into the solution as the oxide or halides. Using such a plating bath to deposit stoichiometric CdTe on a previously deposited HgTe coating results in about 99% lattice match between the CdTe and the HgTe. When CdTe is electrodeposited on a single crystal material, such as single crystal HgTe, the resulting CdTe deposit is also likely to be single crystal. The tin/HgTe substrate is susceptible to the corrosive nature of this bath and must be introduced into the bath under cathodic protection afforded through the potentiostatic control of the surface potential of the tin/HgTe substrate at voltages negative enough to protect the tin/HgTe substrate from oxidation.

INFRARED DETECTORS

Using the techniques of the present invention, various crystalline doped cubic alpha-tin alloys may be produced, having a stoichiometry generally represented as $Sn_xGe_{1-x}$, where x varies from 0 to 1. The actual composition and structure of the alloy is determinative of the electrical characteristics and optical absorption characteristics or bandgap of the material. Tin-germanium alloys can serve as custom lattice matching substrates with dimensions ranging from that of alpha-tin (6.4912 Angstroms—diamond structure) to that of germanium (5.65754 Angstroms—diamond structure). Tin-germanium alloys can have optical bandgaps from that of alpha-tin (0.08 eV at R.T to 0.094 eV at 0 degrees K) to that of germanium 0.67 eV at R.T. to 0.744 eV at 0 degrees K). Custom tin-germanium alloys as active device materials have uses as infrared detectors, temperature sensors and in the manufacture of other semiconductor devices.

The desired $Sn_xGe_{1-x}$ alloy will be produced using substantially the same techniques and substantially the same electrodeposition system as has been described above for the production of crystal alpha-tin. However, germanium cations are added to the electrolytic bath in the proportions required to produce the desired stoichiometry. Aqueous electrolytes must contain fluoride (F−) anions in order to support germanium solubility. Germanium is much more soluble in molten salt baths, making molten salts preferred over aqueous systems in the production of tin-germanium alloys.

The resulting crystalline cubic $Sn_xGe_{1-x}$ will then be processed to produce the desired p/n junction infrared detector. Techniques for producing such detectors include either diffused homojunction or epitaxial growth methods. For example, in the diffused homojunction method, the crystalline cubic $Sn_xGe_{1-x}$ layer 42 (FIG. 6) is coated on one face with a p-type dopant such as Ga or In which is allowed or caused to diffuse into the $Sn_xGe_{1-x}$ layer 42, to form a back surface field layer 44. A secondary layer 47 can be any suitable electrical contact applied to the back surface 44. This diffusion process produces exponential distribution of the so-called bulk hole population through $Sn_xGe_{1-x}$ alloy layer 42, with the highest concentration of holes being near the back surface field layer 44. An n-type dopant, either As or Sb, layer 46, is also coated on $Sn_xGe_{1-x}$ layer 42 and caused to diffuse into layer 42, with the result that n-type dopants diffuse into the surface to form a n+ degeneratively doped layer. Grid 48, having lead 52, is then attached to layer 46 while lead 54 is attached to contact 47. In the practice of the production of such an infrared detector, it may be desirable to stabilize the $Sn_xGe_{1-x}$ crystalline material where x is near 1, through the inclusion of large ionic radii, electronegative or other species as previously specified for pure alpha-tin crystals.

Figure 7:
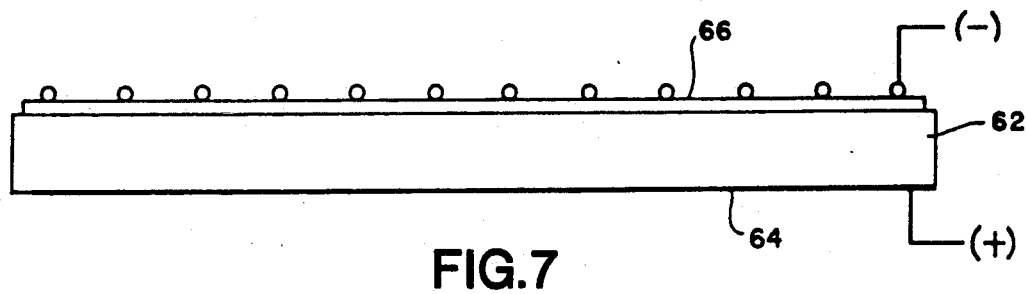
FIGS. 6 and 7 are plan views of infrared detectors using doped crystal cubic alpha-tin material of the present invention.

Referring to FIG. 7, another form of infrared detector is shown. In this infrared detector, $Sn_xGe_{1-x}$ layer 62, produced in accordance with the practice of the present invention, is initially coated and diffused with p-type dopant material 64 which is caused to diffuse entirely through $Sn_xGe_{1-x}$ layer 62 to the surface opposite from that on which it is shown coated. There, now doped $Sn_xGe_{1-x}$ layer 62 (with diffused p-type dopant from layer 64) is in turn coated with n-type material layer 66, epitaxially grown in situ.

Figure 6:
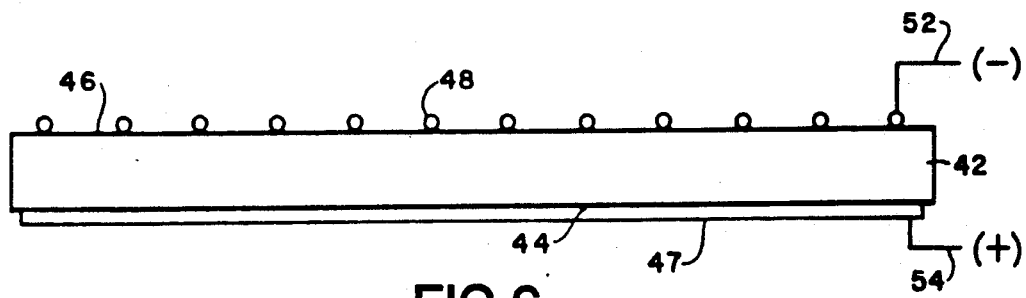

Appropriate transparent or filtering windows, not shown, such as $Hg_xCd_{1=x}Te$, $CdSe_xTe_{1-x}$ or $ZnSe_xTe_{1-x}$ ternary compounds, may be used with the infrared detectors of FIGS. 6 or 7. Other examples are provided in the next section.

ELECTROLYTIC PRODUCTION OF GROUP III–GROUP V SEMICONDUCTOR MATERIALS

Using similar techniques, stoichiometric Group III - Group V semiconductor materials may be produced. To provide specific electrical characteristics (including the capability to use such compounds in photovoltaic cells) or specific spectral filtration characteristics, GaAs, InAs, GaSb, InSb, and ternary mixtures of these compounds can be grown. The possible ternary compounds having the general formulae are $Ga_xIn_{1-x}As$, $Ga_xIn_{1=x}Sb$, $GaAs_xSb_{1-x}$, and $InAs_xSb_{1-x}$, wherein "x" varies from 0 to 1.

As the reduction potentials of As and Sb are quite a bit higher than those of Ga and In, stoichiometric compounds will not be produced if normal plating procedures are used. However, in accordance with the present invention, stoichiometric compounds may be produced by electrodeposition from a bath substantially saturated with Ga and/or In cations and only minor quantities of As and/or Sb cations. Suitable sources of Ga and/or In cations include the halide, nitrate, sulfate, and chlorate salts. The sources of As and/or Sb cations may be their oxides or small concentrations of the soluble salts, including the halides. By controlling the bath so that the concentration of Ga and/or In cations to As and/or Sb cations is about $10^2$ to $10^7$, stoichiometric compounds may be produced. Nitrates and halides must not be mixed, so as to prevent the formation of nitrosyl halide compounds.

ELECTROLYTIC CRYSTAL PRODUCTION IN SPECIFIC METAL SYSTEMS

Table I, below, lists tin and other metal systems operable in the process as described above in obtaining crystal growth of the respective metals from an aqueous solution using one or more of the listed anion components with the respective cations of the elements shown.

TABLE 1

| Cation | Anion And Other Bath Components |
|---|---|
| Silver | Acetate, chlorate, perchlorate, cyanide, fluoroborate, fluorogallate, fluoride, fluorosilicate, lactate, nitrate, oxalate, pyrophosphate, sulfate, ammonia |
| Arsenic | Fluoride, chloride, bromide, iodide, arsenic oxide |
| Gold | chloride, bromide, iodide, cyanide, nitrate, potassium, pyrophosphate, phosphate |
| Bismuth | Acetate, citrate, lactate, molybdate, nitrate, oxalate, propionate, salicylate, sulfate, tartrate, fluoride, chloride, bromide, iodide, ammonium salts, bismuth |

TABLE 1-continued

| Cation | Anion And Other Bath Components |
|---|---|
| | oxide |
| Cadmium | Acetate, borate, bromide, bromate, carbonate, chloride, chlorate, cyanide, formate, fluoride, fluoroborate, fluorosilicate, iodide, iodate, lactate, manganate, molybdate, nitrate, oxalate, phosphate, pyrophosphate, selenate, sulfate, tartrate, tungstate, ammonium chloride, ammonium hydroxide |
| Cobalt | Acetate, benzoate, bromate, bromide, chlorate, chloride, cyanide, chromate, citrate, fluoride, fluorosilicate, formate, iodide, nitrate, oxalate, phosphate, propionate, selenate, sulfate, tartrate, thiocyanate, calcium |
| Copper | Acetate, borate, bromide, bromate, chlorate, chloride, fluoroborate, fluorosilicate, formate, lactate, nitrate, perchlorate, salicylate, selenate, sulfate, ammonium |
| Iron | Acetate, bromide, chloride, fluorosilicate, formate, iodide, lactate, malate, nitrate, oxalate, perchlorate, sulfate, thiocyanate, thiosulfate, calcium |
| Gallium | Chlorate, chloride, fluoride, nitrate, perchlorate, selenate, sulfate |
| Mercury | Acetate, benzoate, bromate, bromide, chlorate, chloride, cyanide, fluoride, iodide, nitrate, sulfate, thiocyanate |
| Indium | Bromide, chlorate, chloride, cyanide, fluoride, nitrate, selenate, sulfate |
| Iridium | Bromide, chloride, fluoride, iodide, nitrate, oxalate, sulfate |
| Nickel | Acetate, benzenesulfonate, borate, bromate, bromide, chlorate, chloride, fluoride, iodide, nitrate, oxalate, phosphate, purophosphate, selenate, sulfate, ammonium |
| Osmium | Bromide, chloride, fluoride, iodide, ammonium hydroxide, alkali metal salts |
| Lead | Acetate, chlorate, citrate, dithionate, fluoroborate, fluorosilicate, nitrate, perchlorate, peroxydisulfate |
| Palladium | Borate, bromide, chloride, cyanide, fluoride, nitrate, selenate, sulfate, ammonium hydroxide |
| Platinum | Bromide, chloride, fluoride, iodide, ammonium hydroxide, alkali metal salts |
| Rhodium | Chloride, nitrate, sulfate, ammonium hydroxide, alkali metal salts |
| Ruthenium | Chloride, ammonium hydroxide, alkali metal salts |
| Antimony | Bromide, chloride, fluoride, iodide, mercaptoacetamide, sulfate, tartrate, antimony oxide |
| Selenium | Bromide, chloride, selenium oxide |
| Tin | Bromide, chloride, chromate, fluoride, iodide, nitrate, oxalate, selenate, sulfate, tartrate |
| Tellurium | Bromide, chloride, tellurium oxide |
| Zinc | Acetate, benzoate, bromate, bromide, butyrate, carbonate, chlorate, chloride, chloroplatinate, cyanide, fluoride, formate, iodide, manganate, nitrate, oxalate, phosphate, pyrophosphate, salicylate, selenate, sulfate, tellurate, thiocyanate, ammonium chloride, ammonium hydroxide |

To produce the best results, the elements should be in the lowest cationic oxidation state. Thus, for example, $Fe^{++}$ cations are superior over $Fe^{+++}$ cations. The mixing of a halide with nitrate results in the formation of a nitrosyl halide which must be avoided to maintain bath activity. Further, organic anions must not be mixed with strong oxidizers so that unwanted contaminants are not formed which will degrade the activity of the solution. Anode geometry can be defined by the crystalline geometry to be fostered. For example, hexagonal crystals such as zinc and cadmium can employ a V-shaped anode separated by 120°, while cubic crystals such as tin can employ an anode separated by 90°.

GEOMETRIC FIELD DYNAMICS

Geometric Field Dynamics (GFD) defines methods capable of promoting self-organizing processes, favorably influencing nucleation and growth processes of materials. Geometric fields occur naturally as a result of ordered arrays of atoms. Arrays of atoms exhibiting molecular scale geometric patterns are duplicated in the microscopic scale nucleation and growth habits of materials. These geometric fields influence nucleation and growth processes and can be amplified by supporting the flow of an energy flux through the system. An energy flux through the growth system promotes dipole orientation, ionic flow, segregation of species and self-organization.

The relationship between the growth of materials and the substrates upon which they are grown is critical to the successful growth of crystalline materials. The processes taught in this disclosure to produce crystals can be grouped into two categories, those which produce free-standing crystalline materials and those which produce coatings on substrates.

The successful growth of crystalline materials in the practice of the present invention involves three prime factors:

1) Electrolytes as growth environments.
   Free-standing growth and the deposition of crystalline coatings both benefit from the availability of suitable electrolytes for most desired coating compositions.
2) The surfaces where crystals grow.
   Free-standing growth is not complicated by the need to deposit material onto foreign substrates. Growth of crystalline coatings on foreign substrates requires special preparation techniques such as graphoepitaxial-abrasion and(or) multiple-cycle-recrystallization.
3) The inducement and accentuation of self-organizing processes.

Free-standing growth in the practice of the present invention is carried on by means of shaping and focusing electric fields to induce currents and a flux of energy through the pointed working electrodes tip in order to establish seed crystals. The flux of energy then passes through the seed crystal, inducing and intensifying self-organizing processes in the Helmholtz double layer structure on the surface of the maturing crystalline seed. The seed crystal then is matured to either a single crystalline morphology (square tin platelets, hexagonal zinc platelets) or is used to begin a continuous process such as the growth of dendritic crystalline ribbon alpha-tin.

Crystalline coating on foreign substrates can only to a limited degree take advantage of self-organizing mechanisms. The beneficial influence of self-organizing mechanisms on the growth of crystalline coatings is diluted over the entire surface area of a foreign working electrode, in contrast to the highly focused flux of energy passing through the tip of the pointed working electrode where self-organizational mechanisms are concentrated into one small region.

Crystalline materials growth in general is dependent on considerations such as the type of deposition system in use, the type of substrate or surface upon which crystal growth is to be achieved and external influences.

Crystalline growth is performed in deposition systems based on vapor chemistry or liquid chemistry. Vapor chemistry of crystal deposition involves the condensation of atoms on surfaces and(or) the reaction of two or more materials on surfaces to produce coatings. Liquid chemistry of crystal deposition involves simple crystallization from a solvent, the reaction of two or more materials to form another material on a surface, the movement of a liquidus/solidus front, and the electrolytic deposition at a working electrode (cathode for cation reduction and anode for anion oxidation). The flow of current induced to flow between two electrodes through an electrolytic deposition system is a flux of energy through the electrolytic deposition system which induces and amplifies self-organization processes. Other vapor or liquid crystal growing systems are not as easily able to have a flux of energy through the system to induce self-organization processes. The free-standing growth systems described herein are able to induce intense self-organization processes and in this way achieve the accelerated growth observed in the dendritic tin ribbon growth system, for example.

Considerations important in the characterization of a substrate for crystal growth include the type of substrate surface (crystalline, polycrystalline, amorphous, prepared by graphoepitaxial abrasion, prepared by multiple-cycle-recrystallization, containing voids, containing crystalline misalignments, containing discontinuities, defect density, orientation, chemical stability of substrate, etc.) and the condition of the substrate surface (cleanliness, contamination, scumming (negative photoresist development residue), the level of hydration, etc.).

A substrate must be compatible with the material to be deposited. Compatibility considerations includes: the chemical stability at the interface of the substrate and the material to be deposited, the crystalline lattice mismatch at the interface between the two materials, the difference in coefficient of thermal expansion and the adhesion, a function of chemical bonding, mechanical bonding, both or neither.

External influences which can be applied to affect crystal growth include electric fields (orthogonal between electrodes and over the surface of substrate contours), magnetic fields, photon incidence, acoustic perturbations, accelerations, thermal gradients, etc. External influences capable of inducing a flux of energy through a growth system provide means of inducing self-organizing mechanisms and improving the speed and quality of crystal growth processes.

Oscillatory deposition/removal cycles are also able to produce improved quality materials. Rudolph Frerichs used such oscillatory deposition/removal cycles in the deposition of niobium thin films by sputtering, and achieved a superior quality coating. The removal cycle is done to remove defects, which are bound less strongly due to dangling bonds. Electropolishing takes advantage of the preferential removal of defects and high spots.

FUNDAMENTALS OF APPLIED GEOMETRIC FIELD DYNAMICS

1. Consider the various nucleation and growth manipulation techniques and determine the potential applicability of one or more of the techniques (i.e., an electric field, or an electric field and a magnetic field, etc.) to the generation of an energy flux through the deposition system.

2. Provide an electrolytic growth environment in which the volumetric density (activity) of reducible (cathodic deposition) or oxidizable (anodic deposition) species is maximized (sufficient) to support the desired growth without the onset of various detrimental diffusion-related limitations.

3. Provide suitable geometric fields and generate an energy flux through the system by use of conformal electrode or other arrangement to provide orientation of applied fields and thus produce a favorable influence on nucleation and growth processes.

4. Provide a pointed (small tip area) working electrode when free-standing-single-crystalline or free-standing-dendritic-crystalline materials are desired. The focusing or an energy flux through the tip of a pointed working electrode produces influential self-organizing processes which accelerate growth rates and improves the quality of the growing crystalline material. Alternatively, provide a custom-shape-substrate with suitable surface preparation such as multiple-cycle-recrystallization or grapho-epitaxial-abrasion to promote oriented nucleation and growth, for epitaxial single-crystalline-conformal depositions.

VARIOUS NUCLEATION AND GROWTH SYSTEMS

Free-standing single crystalline deposits of alpha-tin (Sn) are square as would be expected from considering the geometric fields resulting from the cubic atomic spatial relationships. Similarly, the tin ribbon growth system produces a dendritic crystal with cubic-square geometries. Individual elements in the same column of the periodic table do not necessarily exhibit identical faceting and shape habits. An example of this is encountered with lead ribbon and tin ribbon which are unique and distinct macroscopic shapes. Examples also exist where morphological habits are similar or identical for elements in a column of the periodic table, such as zinc and cadmium hexagonal platelets and columns. Hexagonal crystalline deposits (hexagonal columns or platelets or ribbons or other forms) exhibit hexagonal (120 degrees or multiples or fractions) faceting habits. Tetragonal crystals, such as the beta-tin and indium, exhibit tetragonal faceting habits.

Pentagonal crystals (living things) exhibit pentagonal (5-axial) or related (modified) macroscopic habits, shapes and symmetries. Pentagonal symmetry elements are introduced into the geometric fields of the living systems by the beta-d-ribofuranose sugar molecules and nucleic acids in the DNA (genetic) chains, characterized by 5-atom aromatic rings and 6-atom aromatic rings, whose microscopic fields influence macroscopic 5-axial and 6-axial symmetries and shapes.

Conformal counter (anode for cathodic depositions or cathode for anodic depositions) electrodes such as: cubicsquare (90 degrees, multiples or fractions), hexagonal-6-sided (120 degrees, multiples or fractions), etc., custom desired shapes (turbine blades, etc.), replicate the desired crystalline or custom shape, provide near-uniform counter to working electrode distances, near-uniform ion diffusion distances, vectoral influence on nucleation and other favorable and process enhancing effects.

Ilya Prigogine received the 1977 Nobel Prize in Chemistry for work on self-organizing systems. Characteristically, these systems are chaotic, turbulent, non-linear, far from equilibrium, and are driven by "a flux of energy through the system". Electrolytic growth systems and other epitaxial deposition systems are influenced under the application of a variety of fields. Electrolytic growth systems fulfill the criteria required to exhibit self-organization effects. Driven by the electric fields between working (deposition) electrodes and counter (dissolution) electrodes, ion diffusion proceeds with motions which are chaotic, and turbulent. Ionic species in the electrolytic deposition systems of the present invention introduce non-linearity into system as a result of differences in physical characteristics, differences in ionic diffusivities and differences in ionic drift mobilities. Helmholtz double layers are where nucleation and growth actually occur, and are far from equilibrium, as charge separation is extensive. Non-electrolytic systems which possess driving flux of energy or can be induced to experience a driving flux of energy are capable of self-organization enhancements. Freestanding accelerated growth systems, such as the tin ribbon growth system, exhibit self-organization effects, whereby occurrence of faceting, quality of deposit, rate of growth, process energy requirements, reproducibility and other factors critical to nucleation and growth systems are optimized. Tin ribbon growth has been accelerated to occur with a linear length increase of 0.85 inches/minute (4.25 feet/hour), with a cathodic potential of near $-2.2$ volts-vs-hydrogen. This working (reduction-cathodic deposition) potential is sufficient to cause over-potential (burning the deposit) in conventional tin plating baths with low tin ion (stannous) activity. Diffusion limitations are responsible for the Helmholtz double layer structures operational limitations. In the case of the tin ribbon system the activity of reducible stannous ion $(Sn+2)$ is maximized such that diffusion of replenishing stannous ions from the bulk of the electrolyte through the layer of anions to the depleted cation- containing region of the Helmholtz double layer on the cathodic surface where the nucleation and growth processes are carried on is maximized to support the accelerated growth rate. When the diffusion-replenishment rate is insufficient (due to low bulk concentration of ions of the to-be-deposited material or excessively accelerated growth rates) to maintain a minimal thickness of the layer of reducible ions on the cathodic surface, the double layer structure breaks down and the deposit quality is found to be inferior.

Further development indicates improvements in the tin ribbon deposition system (higher active concentration of reducible tin species, improved potentionstatic control and ribbon puller control) will result in yet more rapid growth rates. Under such high fields, the "flux of energy through the system" is maximized, allowing mirror faceting of the tin to occur (even at such a rapid rate), in such a way as to appear as a metropolis of pyramids. The natural geometric fields of the tin crystal are "amplified" by the "flux of energy through the system", thus exerting a pronounced ordering effect during nucleation and deposition. Deposition systems which have such a "flux of energy through the system", are able to exhibit self-organization phenomena such as: increased occurrence and perfection of faceting and crystallization, increased nucleation-vector orientation, increased nucleation and growth rates. In order to take advantage of these self-organizing effects the volumetric-density (activity) of reducible (cathodic deposit) or oxidizable (anodic deposit) or other species must be maximized in order to avoid diffusion related Helmholtz double layer breakdown (over-potential, the onset of domination by secondary nucleation) and the resultant deterioration in deposition quality.

NUCLEATION MANIPULATION TECHNIQUES

1. Preparation of surfaces to promote single crystalline epitaxial primary nucleation.

Conformal single crystalline epitaxial depositions are dependent on the surface crystallinity or graphoepitaxial preparation, as well as general conditions such as voids, cleanliness and other considerations. Epitaxial deposit quality is limited by the quality of substrate surfaces and conditions.

2. Orthogonal (normal incidence) electric fields and conformal geometry counter electrodes.

Orthogonal electric fields are generated by the use of working (deposit) and counter (dissolution) electrodes which are biased. Systems with separate raw material source and counter (non-sacrificial, non-dissolving) electrode in place of counter (dissolving) electrode are also able to produce orthogonal electric fields. Orthogonal electric fields can be solely applied or in conjunction with surface currents generated by conformal electric field application, and (or) other combinations of field applications. Orthogonal electric fields are generated by the use of "conformal" counter electrode configurations. Conformal counter electrode configurations are in most cases larger scale or smaller scale replicas of the working electrode configurations such as: wire-tubular, sphere-spherical, cube-cubical, torus-toroidal, custom shape-larger or smaller replica of custom shape, etc. Conformal electrode geometry results in near-uniform electrode spacing resulting in near-uniform field intensities and near-uniform ion diffusion distances promoting superior deposition system stability by fulfilling steady-state-transport process requirements. Optimal (maximum) activity (saturation) is maintained by the use of a (working electrode surface area) / (counter electrode surface area) ratio less than unity (1), which for larger conformal counter electrode is easily fulfilled, and which for smaller counter electrode is fulfilled by the use of increased surface area electrode materials (such as those with porosity, convolutions, voids, texturing, folds, or other forms of producing increased surface areas) for use as conformal configuration counter electrodes.

3. Surface Currents and Applied Electric Fields

Electric currents traveling on the surfaces of conductors are capable of influencing orientation of nucleation vectors. Surface electric currents are induced by application of electric fields and influence nucleation and growth by providing ordering and orientation effects. In the case of nucleation and growth of super-conducting wires, a power supply biased from end to end induces longitudinal surface currents in the substrate wire, which acts as a mandrel, promoting organization and orientation. Conformal electric fields generating surface currents may be used solely or in combination with one or more nucleation manipulation techniques.

4. Magnetic fields applied to nucleation and deposition systems.

Magnetic fields effect transport processes, influence nucleation and growth, influence the preparation and properties of magnetic materials, influence reaction kinetics and equilibria, are capable of promoting self-organization by inducing a flux of energy through the system, and other effects. Combinations of magnetic fields with other nucleation manipulation techniques result in new opportunities for materials preparation technology advancements.

5. Influence of photon irradiation during growth of materials.

Photon irradiance can influence such things as: deposition efficiency, deposition rate, composition of alloys and compounds, amorphous to crystalline transitions, etching rates and vectoral orientations, conductivities of working and counter electrodes, and other effects.

6. Influence of acoustic perturbations during solidification.

Melt solidification and casting techniques are influenced by the application of acoustic or vibratory perturbations resulting in solidification front movement control. Acoustic waves and vibrations can promote orientation during solidification, liquid-solid transformations (systems where liquidus and solidus temperatures differ), transport of ions and raw materials, agitate electrolytic systems promoting diffusion, and other effects. Combination of acoustic perturbations with one or more other nucleation manipulation techniques can yield superior results.

7. Influence of kinetic or tensor accelerations during solidification.

Kinetic accelerations have been used to quench cool at rates as great as 1,000,000 degrees C/sec. Chill block melt spinning is a quench method capable of such remarkable cooling rates. Magnets with ultra-fine grains have been produced by General Motors in a technique where the deposit occurs on a spinning disc, with optimal results achieved near 10,000 rpm disc rotation speed.

8. Temperature gradients (fields)

Temperature gradients are used in melt-casting, melt-solidification, vapor transport and condensation, chemical vapor deposition, and other processes such as czochralski crystal growth, bridgman crystal growth, zone-refining, moving liquidus front recrystallization, vacuum evaporation, hot wall epitaxy, halide transport vapor deposition, metal organic chemical vapor deposition, etc. Zone refining and moving liquidus front recrystallization are essentially the same process, differing in process results with zone-refining resulting in purification and moving liquidus front recrystallization resulting in recrystallized coatings able to support and influence single-crystalline epitaxial depositions of materials.

9. Influence of oscillatory deposition and dissolution (removal of defects or electropolishing)

Oscillatory deposition and dissolution cycles where the deposited material thickness is greater than the dissolved (removed) mat®rial thickness resulting in an overall increase in deposit thickness with the passage of time. Rudolph Frerichs first used this technique in the deposition of niobium films by sputtering. The dissolution (removal) part of the cycle is able to remove high points and defects, resulting in maintenance of deposit quality similar to electropolishing techniques. Since defects are preferentially etched, final defect densities are able to be lower than usually is attainable.

ELECTROLYTIC DEPOSITION SYSTEMS

Electrolytic deposition systems offer great diversity in chemistries and capabilities. Fundamental principles common to all of these system include:

1) Deposition takes place at the tip of and suspends from the working electrode or, deposition takes place on the surface of the working electrode.

2) Dissolution takes place from the surface of what is known as the counter electrode replenishing the bulk solution concentration of ions depleted from the solution by deposition at the working electrode.

3) Control of nucleation rates and processes is accomplished by potentiostatic control of the "effective" potential of the surface of the working electrode. This control is done with respect to suitable reference electrodes using feedback and compensation techniques.

4) Chemistry must be chosen appropriately for superior reproducibility, stoichiometric control, morphological control, doping level control and other considerations.

ELEMENTAL COATINGS FROM AQUEOUS SYSTEMS

Aqueous electrodeposition systems are limited primarily by two mechanisms. First, for a large number of elements (all but 24) the solubility (activity) is found to be prohibitively low in aqueous systems. Second, the elements which exhibit reduction potentials more negative than $-0.7$ volts to $-1.0$ volts vs $H+$, are found to be excessively reactive with no deposition observable or with the inclusion of large amounts of hydrogen in the deposit. Hydrogen inclusion is also known as hydrogen embrittlement, and can result in excessive strain, with delamination, fracture, and other instabilities and defects resulting.

Where it is found that the solubility or activity of an elemental species is sufficiently great, and simultaneously the reduction potential for the elemental species is above from $-1.0$ to $-0.7$ volts vs. hydrogen, then aqueous deposition can be carried on.

Deposition will occur with morphologies which can be classified as single-crystalline, poly-crystalline, micro-crystalline, and amorphous (glassy). Micro-crystalline and poly-crystalline deposits are common as plated deposits. Crystalline quality is sacrificed in the majority of these prior art examples, with the integral inclusion of substances which disrupt the Helmholtz double layer, resulting in increased defect densities and secondary nucleation processes. These additives are generally of an organic nature with the desired results being brightness (reflective shine), wetting, leveling, buffering, complexing, etc. Exclusion of brightening and other additives, maximization of depositing species solubilities, and optimization of plating bath chemistry can result in the growth of poly-crystalline and single-crystalline deposits. Amorphous and microcrystalline deposits are promoted by the intentional disruption of the Helmholtz double layer by the addition of brighteners and other additives, the intentional application of working electrode overpotential (operation in region "c" of I-V curve shown in FIG. 3) and restriction of depositing species solubilities (activities) to low or trace amounts.

Cathodic deposition (Sn) is performed in aqueous systems by the electrostatic attraction to and the subsequent reduction of positively charged cations $(Sn+2)$ at the tip of and suspending from or alternatively on the surface of the working electrode (cathode). Alternatively, anodic deposition (Te) is performed in aqueous systems by the electrostatic attraction to and the subsequent oxidation of negatively charged anions (Te-2) at the tip of and suspending from or alternatively on the surface of the working electrode (anode). Cathodic deposition systems are encountered with far greater frequency than anodic deposition systems.

Supporting ions are found to play a pivotal role in determining the morphological character of the deposits which are produced. This can be shown by considering the alpha tin cubic system, where it has been found that deposits from halides alone, i.e., F, Cl, Br, I, differ morphologically from deposits from sulfates alone, i.e., SO4. Well developed growth of dendritic ribbon has been found to be superior in baths with both halides and sulfates, as opposed to the baths with only one or the other type of supporting ions. In preferred embodiments, it is specified that baths shall contain, in the majority of systems, supporting ions of at least two different ionic characters; ionic character being defined by such things as size, shape, effective charge, diffusivity, salt solubility, and other considerations. Alternatively, mixed alkali, Li, Na, K, Rb, Cs, and other cations are used as supporting ions in anodic deposition systems, such as the tellurium anodic deposition system.

Achievement of superior results ca be facilitated by the utilization of the lower oxidation state such as the alpha tin cubic system, with superior results achieved by the use of $Sn+2$ over $Sn+4$ cations.

Supporting ion compatibility is important with the general concepts applicable such as: halides must not be mixed with nitrates in order to avoid the formation of nitrosyl-halides, also, oxidizers and organics may not be compatible due to the need to avoid organic supporting ion decomposition.

Conformal counter electrode configuration is used to provide near-uniform ion diffusion distances, near-uniform voltage drops, oriented electric field vectors, and other desirable results.

Palladium crystals for use in "cold fusion" research and reactor manufacture are producible using the techniques of the present invention. Practice of analogous processes to that used for tin are capable of producing naturally faceted crystals from electrolytes specified for use with palladium.

ALLOYS AND COMPOUNDS FROM AQUEOUS SYSTEMS

Deposition of alloys and compounds in aqueous systems is achieved by using the principles described above, in conjunction with the consideration of such things as the relative reduction potentials, relative supporting ion compatibilities, relative supporting ion salt solubilities, and other factors. Composition of the alloy or compound deposit is controlled and varied by the relative constituent solubilities, which will be inverse to the relative reductive potentials, also, the deposit is controlled by variation of working electrode potential.

Counter electrodes dissolve and replenish the population of ions deposited at the working electrode. Voltage control of individual counter electrodes is used to assure stoichiometric dissolution ratios. Steady-state activities are maintained in this manner with resultant bath reliability and deposit quality optimization.

ELEMENTAL COATINGS FROM MOLTEN SALT SYSTEMS

Molten salt electrodeposition systems have greater capabilities than aqueous systems due to the more aggressive nature of the molten salt environment, which supports solubilities for virtually all elements. In addition, by replacement of hydrogen as the major cationic species by one or more of the electropositive metals, Li, Na, K, Rb, Cs, Al, Be, Mg, Ca, Ba and Zr, elemental depositions are not restricted to species with reduction potentials greater than $-1.0$ volts to $-0.7$ volts -vs- $H+$, as in aqueous systems.

Eutectic mixtures are of great importance in the utilization of molten salt systems. The following molten salt bath compositions have been used in the deposition of various materials:

Molten salts and eutectic mixtures are listed in order of decreasing melting point, with percentages expressed as molar ratios:
1) NaF mp 995 degrees C.
2) BaCl2 mp 962 degrees C.
3) SrCl2 mp 875 degrees C.
4) KF mp 856 degrees C.
5) BaBr2 mp 850 degrees C.
6) LiF mp 845 degrees C.
7) NaCl mp 808 degrees C.
8) Na2F2/44% - SrF2/26% - BaF2/30% mp 804 degrees C.
9) BeF2 mp 797 degrees C.
10) CaI2 mp 784 degrees C.
11) CaCl2 mp 782 degrees C.
12) RbF mp 775 degrees C.
13) KCl mp 772 degrees C.
14) NaF/32% - MgF2/18% - BaF2/50% mp 750 degrees C.
15) NaBr mp 747 degrees C.
16) NaF/65% - MgF2/12% - CaF2/23% mp 745 degrees C.
17) Li2F2/57% - CaF2/21% - SrF2/22% mp 740 degrees C.
18) BaI2 mp 740 degrees C.
19) KBr mp 734 degrees C.
20) CaBr2 mp 730 degrees C.
21) Li2F2/53% - SrF2/21% - BaF2/26% mp 721 degrees C.
22) RbCl mp 717 degrees C.
23) MgCl2 mp 714 degrees C.
24) MgBr2 mp 711 degrees C.
25) Li2F2/50.5% - CaF2/25.5% - BaF2/24% mp 710 degrees C.
26) Na2F2/62% - CaF2/12.5% - SrF2/25.5% mp 699 degrees C.
27) K2F2/62% - CaF2/12.5% - SrF2/25.5% mp 699 degrees C.
28) KI mp 685 degrees C.
29) CsF mp 682 degrees C.
30) RbBr mp 680 degrees C.
31) NaF/53% - CaF2/14% - BaF2/33% mp 680 degrees C.
32) K2F2/53% - CaF2/14% - BaF2/33% mp 680 degrees C.
33) Li2F2/47% - MgF2/35% - CaF2/18% mp 676 degrees C.
34) Na2F2/31% - K2F2/40% - SrF2/29% mp 664 degrees C.
35) NaI mp 662 degrees C.
36) Li2F2/35% - MgF2/35% - BaF2/30% mp 654 degrees C.
37) MgI2 mp 650 degrees C.
38) Li2F2/36% - MgF2/39% - SrF2/25% mp 646 degrees C.
39) CsCl mp 645 degrees C.
40) SrBr2 mp 643 degrees C.
41) RbI mp 640 degrees C.
42) CsBr mp 636 degrees C.
43) LiF/47% - NaF/43% - MgF2/10% mp 630 degrees C.
44) Na2F2/51% - K2F2/36% - BaF2/13% mp 621 degrees C.

45) NaF/21% - KF/5% - RbF/74% mp 621±10 degrees C.
46) CsI mp 621 degrees C.
47) LiF/53% - NaF/36% - CaF2/11% mp 616 degrees C.
48) LiCl mp 610 degrees C.
49) LiF/18% - NaF/17% - AlF3/65% mp 565 degrees C.
50) KF/32% - CsF/60% - MnF2/8% mp 560 degrees C.
51) LiBr mp 547 degrees C.
52) SrI2 mp 515 degrees C.
53) BeBr2 mp 488 degrees C.
54) LiCl/71% - LiF/29% mp 485 degrees C.
55) BeI2 mp 480 degrees C.
56) NaF/52% - RbF/15% - BeF2/33% mp 477 degrees C.
57) Li2F2/54.5% - Cs2F2/44.0% - CaF2/1.5% mp 476 degrees C.
58) LiF/40% - CsF/58% - MnF2/2% mp 476 degrees C.
59) Li2F2/49% - K2F2/46% - BaF2/5% mp 472 degrees C.
60) Li2F2/39.0% - Cs2F2/60.5% - CaF2/0.5% mp 462 degrees C.
61) LiF/46.5% - NaF/11.5% - KF/42.0% mp 454 degrees C. (FLINAK)
62) LiF/66% - BeF2/34% mp 454 degrees C.
63) Li2TiF6/85% - K2TiF6/13% - Na2TiF6/2% mp 450 degrees C.
64) CaCl2/47.0% - NaCl/38.5% - BaCl2/14.5% mp 450 degrees C.
65) ZrBr4 mp 450 degrees C.
66) LiF/44% - NaF/12% - KF/40% - MgF2/4% 449 degrees C.
67) LiI mp 449 degrees C.
68) LiF/48% - NaF/11% - CsF/41% mp 448 degrees C.
69) LiF/9% - NaF/37% - CsF/54% mp 446 degrees C.
70) LiF/44.9% - NaF/11.5% - KF/40.6% - CaF2/3% mp 444 degrees C.
71) LiF/40% - KF/32.5% - RbF/27.5% :ap 440±10 degrees C.
72) ZrCl4 mp 437 degrees C.
73) LiF/26% - NaF/37% - ZrF4/37% mp 436 degrees C.
74) LiF/42% - NaF/6% - RbF/52% mp 435 degrees C.
75) KCl/67% - MgCl2/33% mp 435 degrees C.
76) LiF/65.6% - BeF2/29.4% - ZrF4/5.0% mp 434 degrees C.
77) LiF/46.5% - NaF/6.5% - RbF/47% mp 426 degrees C.
78) BeCl2 mp 405 degrees C.
79) KF/55% - AlF3/5% - ZrF4/40% mp 400 degrees C.
80) MgCl2/60% - NaCl/20% - KCl/20% mp 396 degrees C.
81) NaCl/33.0% - KCl/21.5% - MgCl2/45.5% mp 393 degrees C.
82) NaF/10% - KF/48% - ZrF4/42% mp 385 degrees C.
83) NaF/6.2% - RbF/45.8% - ZrF4/48% mp 380 degrees C.
84) NaF/48.4% - KF/3.5% - BF3/48.1% mp 377±2 degrees C.
85) CsAlCl4 mp 364 degrees C.
86) LiCl/58.5% - KCl/41.5% mp 361 degrees C.
87) NaF/40% - BeF2/60% mp 360 degrees C.
88) LiCl/43% - NaCl/33% - KCl/24% mp 357 degrees C.
89) LiF/48% - BeF2/50% - ZrF4/2% mp 355 degrees C.
90) LiCl/58.8% - KCl/41.2% mp 353 degrees C.
91) LiBr/60% - KBr/40% mp 348 degrees C.
92) LiF/11.7% - LiCl/29.1% - LiI/59.2% mp 341 degrees C.
93) CsAlBr4 mp 340 degrees C.
94) NaF/57% - BeF2/40% - ZrF4/3% mp 335 degrees C.
95) KBr/65% - MgBr2/35% mp 334 degrees C.
96) RbAlCl4 mp 331 degrees C.
97) LiF/23% - NaF/41% - BeF2/36% mp 328 degrees C.
98) LiCl/59.3% - CsCl/40.7% mp 323 degrees C.
99) LiCl/58.0% - NaCl/1.7% - CsCl/40.3% mp 320 degrees C.
100) LiF/5% - NaF/53% - BeF2/42% 318 degrees C.
101) LiCl/58.3% - RbCl/41.7% mp 318 degrees C.
102) LiF/31.5% - NaF/31% - BeF2/37.5% mp 315 degrees C.
103) LiCl/44% - BeCl2/56% mp 300 degrees C.
104) LiF/11% - RbF/34% - BeF2/55% mp 300±5 degrees C.
105) LiF/33% - RbF/8% - BeF2/59% mp 295±5 degrees C.
106) RbAlBr4 mp 278 degrees C.
107) KAlCl4 mp 256 degrees C.
108) CsAlI4 mp 250 degrees C.
109) LiAlI4 mp 237 degrees C.
110) NaAlI4 mp 220 degrees C.
111) KAlI4 mp 207 degrees C.
112) NaAlBr4 mp 201 degrees C.
113) LiAlBr4 mp 197 degrees C.
114) AlCl3 mp 192 degrees C.
115) KAlBr4 mp 191.5 degrees C.
116) AlI3 mp 191 degrees C.
117) RbAlI4 mp 179 degrees C.
118) NaAlCl4 mp 151 degrees C.
119) TiI4 mp 150 degrees C.
120) AlCl3/75% - CsCl/25% mp 148 degrees C.
121) SnI4 mp 144.5 degrees C.
122) LiAlCl4 mp 144 degrees C.
123) AlI3/71% - RbI/29% mp 135 degrees C.
124) KAlCl4/50% - AlCl3/50% mp 128 degrees C.
125) NaAlCl4/50% - KAlCl4/50% mp 125 degrees C.
126) AlI3/70% - NaI/30% mp 123 degrees C.
127) NaAlCl4/50% - AlCl3/50% mp 108 degrees C.
128) NaAl2Br7 mp 105 degrees C.
129) AlI3/67% - KI/33% mp 105 degrees C.
130) RbAl2Br7 mp 98 degrees C.
131) AlBr3 mp 97.5 degrees C.
132) KAl2Br7 mp 96 degrees C.
133) AlBr3/76% - NaBr/24% mp 95 degrees C.
134) AlCl3/62.13% - NaCl/25.17% - KCl/12.7% mp 94 degrees C.
135) AlCl3/63.5% - NaCl/20% - KCl/16.5% mp 89 degrees C.
136) AlBr3/74% - KBr/26% mp 88 degrees C.
137) RbAlBr4 mp 83 degrees C.
138) AlCl3/66% - NaCl/20% - KCl/14% :np 70 degrees C.
139) AlCl3/ % - LiCl/ % - NaCl/ % - KCl/ % mp 61 degrees C.
140) BI3 mp 43 degrees C.
141) TiBr4 mp 38.5 degrees C.
142) SnBr4 mp 31 degrees C.

143) SnBr3Cl mp 1 degree C.
144) SnBr2Cl2 mp −20 degrees C.
145) SnBrCl3 mp −31 degrees C.
146) SnCl4 mp −33 degrees C.

Halides of many elements form eutectic mixtures with the molten metal halide salts. Molten salt electrolytes are available with melting points as low as −33 degrees celsius. The majority of work in the past has been at temperatures above 454 degrees (the melting point of FLINAK). Chloride, bromide and iodide salt mixtures are excellent candidates as low temperature molten salt baths. Chloride, bromide and iodide-based molten salt baths are susceptible to decomposition in air, so must be operated in inert atmosphere. A table describing individual elements and useable bat compositions follows:

| Element | Desired Melting Point Temperature °C. | Molten Salt Electrolytes |
|---|---|---|
| beryllium, | 1287+/−5 | baths: 1, 4, 6, 7, 9, 12, 13, 15, 19. 22. 28–30, 35, 39, 41, 42, ,45, 46, ,48} 51, 53–56, 61, 62, 67–69, 71,74, 77, 78, 86–88, 90–92, 97–105 |
| magnesium, | 648.8+/−0.5 | baths:39, 41–43, 45, 46, 48, 51, 54, 61, 66–69, 71, 74, 75, 77, 80, 81, 86, 88, 90–92, 95, 98, 99, 101 |
| calcium, | 839+/−2 | baths: 7, 10, 11, 12, 13, 15, 19, 22, 28–30, 35. 39, 41, 42, 45–48. 51, 57, 60, 61, 67–71, 74, 77, 86. 88, 90–92, 98, 99, 101 |
| strontoim, | 769 | baths: 22. 28–30, 35. 39, 41, 42, 44–46, 68, 51. 53–56, 59, 61, 62, 67–69, 71, 74, 77, 78, 86–88, 90–92, 97–105 |
| boron. | 2300 | baths: 1, 4, 6, 7, 9, 12, 13, 15, 19, 22, 28–30, 35, 39, 41, 42, 45, 46, 48, 51, 53–56. 61, 62, 67–69. 71. 74. 77. .78. 84. 86–88, 90–92, 97–105 |
| carbon. | 3550 | baths: 1, 4. 6, 7, 9, 12, 13, 15, 19, 22. 2, 8–30. 35. 39, 41, 42, 45, 46, 48, 51, 53–56, 61, 62. 67–69. 71. 74, 77, 78. 86–88, 90–92, 97–105 |

Supporting solvent electrolyte cation composition options: Li, Na. K. Rb. Cs.

| silicon. | 1410 | baths: 1,4. 6, 7, 9, 12, 13, 15, 19, 22, 28–30, 35, 39, 41, 42, 45, 36, 48, 51. 53–56, 61, 62, 67–69, 71, 74, 77, 78, 86–88, 90–92. 97–105 |
| germanium. | 937.4 | baths: 4, 6, 7, 9, 12, 13, 15. 19, 22, 28–30, 35. 39, 41, 42, 45, 46. 48, 51, 53–56, 61, 62. 67–69. 71, 74, 77, 78. 90–92, 97–105 |

Supporting solvent electrolyte cation compositions options: Li. Na. K. Rb, Cs.

| scandium. | 1539 | baths: 1–48, 51–57, 59–62, 64, 66–71, 74, 75, 77, 78, 80, 81, 86–88, 90–92, 95, 97–105 |
| yttrium, | 1523+/−8 | baths: 1–48, 52–57, 59–62, 64, 66–71, 74, 75, 77, 78, 80, 81, 86–88, 90–92, 95, 97–105 |
| lanthanum, | 920+/−5 | baths: 3–48, 51–57, 59–62, 64, 66–71, 74, 75, 77, 78, 80, 81, 86–88, 90–92, 95, 97–105 |
| actinium, | 1050 | baths: 1–48, 51–57, 59–62, 64, 66–71, 74, 75, 77, 78, 80, 81, 86–88, 90–92, 95, 97–105 |
| titanium, | 1660+/−10 | baths: 1–48, 51–57, 59–64, 66–71, 74, 75, 77, 78, 80, 81, 86–88, 90–92, 95, 97–105, 119, 141 |
| hafnium, | 2227+/−20 | baths: 1–48, 51–57, 59–62, 64, 66–71, 74, 75, 77, 78. 80, 86–88, 90–92, 95, 97–105 |
| vanadium, | 1890+/−10 | baths: 1–48, 51–57, 59–62, 64, 66–71, 74, 75, 77, 78, 80, 81, 86–88, 90–92, 95, 97–105 |
| niobium, | 2468+−10 | baths: 1–48, 51–67, 59–62, 64, 66–71, 74, 75, 77, 78, 80, 81, 86–88, 90–92, 95, 97–105 |
| niobium, | 2468+/−10 | baths: 1–48, 51–67, 59–62, 64, 66–71, 74, 75, 77, 78, 80, 81, 86–88, 90–92, 95, 97–105 |
| tantalum, | 2996 | baths: 1–48, 51–57, 59–62, 64, 66–71, 74. 75, 77, 78, 80, 81, 86–88, 90–92, 95, 97–105 |
| chromium, | 1857+/−20 | baths: 1–48, 51–57, 59–62, 64, 66–71, 74, 75, 77, 78, 80, 81, 86–88, 90–92, 95, 97–105 |
| molybdenum, | 2617 | baths: 1–48, 51–57, 59–62, 64, 66–71, 74, 75, 77, 78, 80, 81, 86–88, 90–92, 95, 97–105 |
| tungsten, | 3410+/−20 | baths: 1–48. 51–57, 59–62, 64, 66–71, 74, 75, 77, 78, 80, 81, 86–88, 90–92, 95, 97–105 |
| manganese | 1244+/−3 | baths: 1–48, 50–62, 64, 66–71, 74, 75, 77, 78, 80, 81, 86–88, 90–92, 95, 97–105 |
| technetium, | 2172 | baths: 1–48, 51–57, 59–62, 64, 66–71, 75, 77, 78, 80, 81, 86–88, 90–92, 95, 97–105 |

Supporting solvent electrolyte cation composition options: Li, Na. K. Rb, Cs, Be, Mg, Ca, Sr, Ba.

| zirconium, | 1852+/−2 | baths: 1–48, 51–57, 59–62, 64–83, 86–92, 94, 95, 97–105 |
| zinc, | 419.58 | 78–83, 86–92, 94, 95, 97–105 |

Supporting solvent electrolyte cation composition options: Li, Na, K, Rb, Cs, Be, Mg, Ca, Sr, Ba, Zr.

| rhenium, | 3180 | baths: 1–146 |
| iron, | 1535 | baths: 1–146 |
| ruthenium, | 2310 | baths: 1–146 |
| osmium, | 3045+/−30 | baths: 1–146 |
| cobalt, | 1495 | baths: 1–146 |
| rhodium, | 1966+/−3 | baths: 1–146 |
| iridium, | 2410 | baths: 1–146 |
| nickel, | 1453 | baths: 1–146 |
| palladium, | 1552 | baths: 1–146 |
| platinum, | 1772 | baths: 1–146 |
| copper, | 1083.4+/−0.2 | baths: 1–146 |
| silver, | 961.93 | baths: 3–146 |
| gold, | 1064.43 | baths: 1–146 |
| aluminum, | 660.37 | baths: 36–146 |
| arsenic, | 817 (28 Atm) | baths: 44–146 |
| antimony, | 630.74 | baths: 44–146 |
| tellurium | 449.5+/−0.3 | baths: 68–146 |

Supporting solvent electrolyte cation composition options: Li, Na, K, Rb, Cs, Be, Mg, Ca, Sr, Ba, Zr, Al. (note: Zr + 4 ion must be excluded from baths containing I- anion.)

| cadmium, | 329.9 | baths: 100–107, 112–115, 118–120, 122, 124, 125, 127, 128, 129, 130–139, 141, mixtures of 119 and 141 |
| thallium, | 303.5* | baths: 103–105, 107, 114, 118–120, 122, 124, 125, 127, 134, 135, 138, 139, 141, mixtures of 119 and 141 |
| lead, | 327.50 | baths: 98–120, 122–141, mixtures of 119 and 141 |

Supporting solvent electrolyte cation composition: Li, Na, K, Rb. Cs, Be, Al. (note: aluminum. Al3+ ion must be excluded from cadmium deposition baths if the supporting solute electrolyte contains iodide, I− anions. In addition, aluminum, Al3+ ion must be excluded from both bromide, Br−, and iodide, I− containing thallium deposition baths.)

| indium, | 156.61 | baths: 118–120, 122–141, mixutres of 119 and 141 |
| tin. | 231.9681 | baths: 110–146, mixtures of 119 and 141 |
| bismuth, | 271.3 | baths: 107–120, 122–141, mixtures of 119 and 141 |
| selenium, | 217 | baths: 111–120, 122–141, mixtures of 119 and 141 |

Supporting solvent electrolyte cation composition options: Li, Na, K, Rb, Cs, Al.

MOLTEN SALT CONTAINMENT

Crucibles must be chosen which are able to survive the corrosive nature of the molten salt baths. Corrosion of the crucible results in contamination of the bath and ultimately results in the failure of the container. Graphite heads up the list of preferred materials from which to construct crucibles for the performance of the current invention. The materials which have been used in molten salt electrolysis includes: graphite, pyrolytic graphite, BN (boron nitride), SiC (silicon carbide), Ir (iridium), Pt (platinum), W (tungsten), Mo (molybdenum), Zr (zirconium), Au (gold), Ni (nickel), Stainless Steel, SiO2 (silicon dioxide), Al2O3 (aluminum oxide), BeO (beryllium oxide), MgO (magnesium oxide), CaO (calcium oxide), ZrO2 (zirconium oxide), Ti2O3 (titanium oxide), Pyrex, Vycor, borosilicate glass, or other suitable material. Crucibles to contain corrosive molten salt electrolytes are often lined with materials to provide longer service life, less contamination of the melt through corrosion, and avoid excessive cost (Au lining versus Au crucible). This liner serves as a non-porous coating through which the molten salts do not diffuse. The liner also can lessen the problem of carbon tetrahalide formation in the case of graphite crucibles.

REFERENCE ELECTRODES

Reference electrodes which are found to be useful in the potentiostatic control of the surface potential of the working electrode in molten salts can be of the Pb/PbC12, Ni/NiC12, Ag/AgCl, Al/AlF3, Cu/CuClx, Mg/MgO, or other metallic/halide or metallic/oxide salt couples. BN (boron nitride) has been shown to provide reasonable service as porous frit material in such reference electrodes exposed to alkali halide salt mixtures.

TIN CRYSTALS FROM MOLTEN SALT SYSTEMS

Tin crystalline material is produced from many molten salt baths such as bath numbers 110-146. Bath composition number 138 is used in this exemplary system. The bath composition number 138 is oomposed of AIC13/66% - NaCl/20% - KCl/14% and has a melting point of 70 degrees C. This bath is prepared by melting a mixture containing the respective quantities of aluminum and alkali halide salts in a sealed graphite crucible at near 100 degrees C. containing inert atmosphere such as N2 (nitrogen). Once the bath is molten, purification is carried on by the bubbling of HCL (hydrochloric) and H2 (hydrogen) gases through the bath to remove any oxygen while the bath is under vacuum.

At this point SnC12 (stannous chloride) is added to saturation to the bath in order to provide sufficient bulk replenishing concentration (activity) of the stannous cations.

Electropurification of the bath is now carried on by the insertion of a sacrificial high-purity tin anode into the bath and the insertion of a cathode. Current is passed from the anode to the cathode. The cathode is operated at a potential slightly below the cathodic surface potential expected to be used in the production of the desired crystalline forms until the clean reduction potential shown in FIG. 4 and discussed earlier is achieved.

Once oxygen removal and electropurification are complete, insert a shaped anode and pointed cathode and begin passage of current through the bath. A cluster of seed crystals will begin to grow from the tip of the pointed cathode into the solution toward the anode. Pruning of this cluster of crystals is done to isolate one chosen seed from competing seeds. This seed then has its surface potential adjusted to the value known to produce the desired crystalline form. The seed crystal is then matured into a single crystal over time (morphology produced in region "a" of the I-V curve of FIG. 3) or is used to start a continuous process such as the growth of dendritic ribbon material (morphology produced in region "b" of the I-V curve of FIG. 3).

PALLADIUM AND TITANIUM CRYSTALS FROM MOLTEN SALT SYSTEMS

Palladium and titanium metals have been reported to be capable of "cold fusion" reactions. It has also been reported that the crystalline integrity of the col fusion crystals is important, with work hardened crystals unable to produce the cold fusion reactions.

The present invention can produce free-standing crystalline palladium and titanium materials. The bath compositions compatible with Pd and Ti are specified in the present disclosure in the section on elaments from molten salts. Practice of the present invention is analogous regarding equipment and procedures with the example given for tin from molten salts.

ALLOYS AND COMPOUNDS FROM MOLTEN SALT SYSTEMS

Alloys and compounds of virtually any composition can be produced by the appropriate choice of molten salt deposition system. Examples of various materials deposition systems include those which produce single-crystalline, dendritic crystalline, poly-crystalline, micro-crystalline, and amorphous materials. Molten salt electrolytic deposition systems are not subject to the limitations involving low ion solubility and the incorporation of unwanted hydrogen in the deposit. Molten salt systems are siqnificantly more versatile than aqueous electrolytic deposition systems. Reduction potentials can be used to estimate the activities (solubilities) required for various depositions, analogously to the aqueous systems.

SUPERCONDUCTIVE MATERIALS FROM MOLTEN SALT SYSTEMS

Superconductive materials such as the intermetallic alloys: Nb-Ti (niobium-titanium alloys), compounds: Nb3Sn (niobium tin), Nb3Ge (niobium germanium), and the ceramic oxides: YBaCaCuO (yttrium barium calcium copper oxide), BiSrCaCuO (bismuth strontium calcium copper oxide), TlBaCaCuO (thallium barium calcium copper oxide), and other compositions can be produced in the manner of the present invention by appropriate choice of molten salt deposition systems.

The first group of superconductive materials, the intermetallic alloys and compounds, can be produced using molten salt baths: 1-6, 8, 9, 11-15, 17-20 (see molten salt table), and halide (F, Cl, Br, I) molten salt compositions containing one or more of these cations: Li, Na, K, Rb, Cs, Be, Mg, Ca, Sr, and Ba. The deposition is carried on in the manner of the present invention to produce free-standing morphologies, and in addition can be used to deposit coatings on various substrates and contours.

The second group of superconductive materials, the ceramic oxides, can be produced using molten salt baths: 1, 11, 13, 17, 18, 19 (see molten salt table), and fluoride (F) molten salt compositions containing one or more of these cations: Li, Na, K, Rb, and Cs. These oxide compositions can be deposited out of molten fluoride salt systems by the electrolytic reduction of the constituent metal ions ($Y+3$, $Ba+2$, $Cu+$, $Bi+3$, $Sr+2$, $Ca+2$, and $Tl+3$) and oxygen ($O+2$). Oxygen is able to exist as a cation ($0+2$) in fluoride melts in the form of OF2 (oxygen di-fluoride). Oxygen di-fluoride is bubbled into the molten salt bath to replenish the bath with cationic oxygen during the process of the present invention. Superconductive oxides with stoichiometric oxygen content can be produced in the manner of the present invention as free-standing morphologies, and as coatings on various substrates and contours.

ELECTRODEPOSITION FROM ORGANIC SOLVENTS, ORGANIC ACIDS, AND OTHER UNUSUAL SYSTEMS

Organic electrodeposition systems are able to deposit "difficult" and "unique" compositions. Aluminum, beryllium, lithium, molybdenum, tungsten, other metals and alloys, and conductive polymers (for example, poly-pyrrole) were deposited out of organic solvents electrolytically. In the case of the Mo, and W, the deposits included fairly large fractions of oxygen. Te and Sn have been electrodeposited out of organic acids, with many other examples in the literature of unique plating bath compositions.

The following solvents have been used to deposit various materials electrolytically: methanol, ethanol, acetic acid, fluoroacetic acid, trifluoroacetic acid, isopropyl alcohol, acetonitrile, dimethylsulfoxide, formamide, N,N-dimethylacetamide, dimethyl formamide, diethyl formamide, tetrahydrofuran, fluoroboric acid, citric acid, lactic acid and others.

Electrodeposition with organic electrolytes can be performed to deposit elements with lower reduction potentials than could be accommodated with aqueous chemistry. Organic electrolytes are useful in depositing materials which would otherwise have to be deposited out of molten salt electrolytes under more corrosive conditions and higher temperatures.

Great care must be exercised in the formulation of organic electrolyte systems. The incompatibility of ionic metal salts with organic electrolytes can represent a significant fire or worse yet explosion hazard.

ELECTROLYTIC GROWTH AND DEPOSITION SYSTEMS

The electrolytic deposition techniques of the present invention are capable of producing both free-standing crystalline materials and coatings of varying compositions. Free-standing crystalline materials are prepared with single-crystalline and dendritic-crystalline morphologies. Coatings deposited from the electrolytic systems of the present invention can be single-crystalline, dendritic crystalline, poly-crystalline, or amorphous in nature.

FREE-STANDING NATURALLY FACETED SINGLE CRYSTALLINE HABIT GROWTH SYSTEMS

Free-standing naturally-faceted single-crystalline growth of materials, in systems described in the present invention, is performed in a manner similar to the production of square cubic alpha tin shown in FIG. 2a, and grown in region "a" of I-V curve shown in FIG. 3. Tin has been prepared in cubic and tetragonal single-crystalline free-standing morphologies. Lead has been prepared in octahedral single-crystalline free-standing morphology. Zinc and cadmium have been prepared in hexagonal platelet form. Indium has been prepared with tetragonal morphology. Other materials for which there are electrolytic bath deposition systems specified within this disclosure can be prepared in various single-crystalline free-standing morphologies. Free-standing single-crystal growth is performed in the practice of the present invention by taking advantage of the beneficial nature of self-organizing processes and the beneficial nature of conformal (in this case scaled replica) electrode geometry. Self-organizing processes, as described by Ilya Prigogine involving a flux of energy through the system (current flow between the anode and cathode), are underway in the electrolytic processes of the present invention. Conformal electrode geometry involves shaping the counter electrode to substantially replicate the working electrode's shape and in so doing to provide shaped electric fields, near-uniform field intensities, near-uniform replenishing ion diffusion distances, and other beneficial effects. Such deposition involves the use of point-electrode-dynamics (pointed working electrode), conformal counter electrode geometry, and optimized deposition bath systems, such as aqueous solutions, molten salts, organic baths, or other suitable electrodeposition systems.

FREE-STANDING ACCELERATED-GROWTH DENDRITIC CRYSTALLINE RIBBON SYSTEMS

Dendritic crystalline ribbon growth is performed in a manner by which large areas of crystalline sheet are produced. Cubic alpha-tin is the system in the highest stage of development, yielding deposition rates of near 0.85 inches/minute (4.25 feet/hour) linear growth rate. The ribbon is found to exhibit mirror-like multi-faceted morphology, appearing as a city of pyramids.

High-speed growth processes are supported in such high-speed dendritic ribbon growths, wherein a large "flux of energy through the system" promotes self-organizing processes and amplifies the naturally occurring and/or the artificially generated geometric fields. Such self-organizing processes and amplified geometric fields facilitate accelerated diffusion and organization rates for tin cations enabling the domination by primary nucleation processes at high growth rates. Faceted deposition is indicative of highly ordered, highly desirable, ion transport and replenishment processes, accelerated ionic site placement selection, ionic reduction, and other favorable effects and results.

Dendritic growth of other metals is suitable as a preparation technique useful in providing large areas of oriented, crystalline substrates of varying lattice constants and chemical compatibilities. Tin cubic morphology dendritic ribbon as discussed previously has been prepared. Lead dendritic ribbon has a leaved morphology. Hexagonal platelets of Zn and Cd have been observed, and it is expected that a form of dendritic hexagonal ribbon is achievable. Other metals of other lattice types may also produce similar ribbon deposition opportunities.

Growth of ribbon is found to occur in region "b", of the I-V curve in FIG. 3 and depicted in FIGS. 2b–2d. It can be observed that the occurrence and spacing of the orthogonal twinning planes along the central rib twinning plane is related to deposition rates, with the occurrence and density of orthogonal twinning planes increased as growth rate is increased. Dendritic growth is depicted in FIG. 2d, with the "main stem" being an extension of the working electrode point, with primary branches, secondary branches and higher order branches being orthogonal to each other. Orthogonal twinning planes occur with frequency dependent on variables such as growth rate, species activity, agitation, impurities in the bath, temperature, pulling rate, counter electrode spacing, and other transport and deposition mechanism influences. Each orthogonal twinning plane is indicative of secondary nucleation processes, which become dominant as the spacing between orthogonal twinning planes decreases to zero (infinite number of orthogonal twinning planes along the main stem), coincident with the maximum achievable growth rate for the system in question.

CONFORMAL SINGLE-CRYSTALLINE COATINGS ELECTROLYTICALLY DEPOSITED ON CUSTOM-SHAPE SUBSTRATES

Custom-shape-substrates suitably prepared, when used in conjunction with appropriate deposition techniques, yield single crystalline deposits, which when freed from the substrates, are useful in service as electromagnetic, structural or mechanical components or apparatus.

Optimization of electrolytic deposition system parameters such as maximized activities of ions of the to-be-deposited material (cations for reduction at a cathode or anions for oxidation at an anode), conformal counter (anode for cathodic deposition or cathode for anodic deposition) electrode geometry, potentiostatic control of effective working (cathodic for cathodic deposition or anodic for anodic deposition) electrode surface potential, surface quality and compatibility with the early embryonic primary nucleation processes, chemical compatibility of substrate nucleation surface and nucleation processes, and other considerations, yield superior results.

Suitable surface preparation techniques serve to orient and enhance organizational processes during the critical embryonic primary nucleation phase. Surface preparation techniques include cleaning, graphoepitaxial abrasion, multiple-cycle recrystalization, ion milling, ion implantation, etching, lapping, polishing and other types of treatment. Single-crystalline epitaxial coatings on customshaped substrate mandrels are producible in many instances with the assistance of techniques such as graphoepitaxial abrasion and multiple-cycle recrystallization. Graphoepitaxial abrasion provides orientation for the nucleation of common orientation small crystallites capable of "healing" during the coating process to produce a single-crystalline coating. Graphoepitaxial abrasion is performed through mechanical scribing, sand blasting, optical lithographic techniques and other techniques capable of providing an orienting influence on the nucleation at the beginning of the coating process. Multiple-cycle recrystallization involves the preparation of a crystalline coating on a custom-shaped substrate mandrel capable of promoting single crystalline epitaxial nucleation. Multiple-cycle recrystallization involves the application of a preparatory coating (the coating has a melting point below that of the custom-shape substrate mandrel, but above that of the selected molten salt deposition bath which it will be inserted into) onto the surface of a custom-shaped substrate mandrel. The preparatory coating is recrystalized through the movement in the same direction each time of liquidus/solidus fronts across the surface. The preparatory coating is recrystallized (preferably multiple times) to form a crystalline coating useful as a substrate surface on a custom-shaped mandrel for use as an epitaxially compatible surface in the performance of the present invention. Grapho-epitaxial abrasion provides coarse orientation and is suitable where the use of multiple-cycle-recrystallization techniques are not possible or available. Multiple-cyclerecrystallization techniques provide fine orientation of crystallites in the plane of the surface, and is to be preferred in all instances, over grapho-epitaxial-abrasion techniques.

Crystalline structural, mechanical, or other components manufactured using the techniques of the present invention can be made with custom thickness control to strengthen high stress zones and lighten low stress zones, minimizing weight. One-piece housings, framing networks, vehicle hulls and fuselage structures, aircraft engine turbine blades, and other items useful in the manufacture of products can be produced with the processes of the present invention.

Coatings can provide superior: heat dissipation, conductivity, environmental degradation resistance, abrasion and wear resistance, optical, electrical, mechanical and other properties and capabilities of components. Decorative coatings can provide aesthetic appeal. Coatings can act as high-contrast surfaces for evidential purposes.

POLYCRYSTALLINE AND AMORPHOUS COATINGS

Polycrystalline and amorphous coatings can be electrolytically deposited onto custom-shaped substrate mandrels through the processes of the present invention. Polycrystalline and amorphous materials are produced by controlling various factors such as: limiting the activity (concentration) of ions (cations for cathodic deposition or anions for anodic deposition) of the to-be-produced material, mechanical agitation, ultrasonic agitation, maintaining working electrode potentials in regions "b" and "c" of the I-V curve of FIG. 3, addition of briqhtening agents, addition of surface tension modifying agents, and other measures. Coatings produced in the process of the present invention can be built up to desired thickness and strength and then used as freestanding components when freed from substrate mandrels. Coatings may act as: protective, wearresistant, optically useful, thermally useful, or other useful purpose.

MATERIALS OPTIONS

Materials systems such as those of the elements beryllium, magnesium, calcium, strontium, barium, radium, scandium, yttrium, lanthanum, actinium, titanium, zirconium, hafnium, vanadium, niobium, tantalum, chromium, molybdenum, tungsten, manganese, technetium, rhenium, iron, ruthenium, osmium, cobalt, rhodium, iridium, nickel, palladium, platinum, copper, silver, gold, zinc, cadmium, boron, aluminum, indium, thallium, carbon, silicon, germanium, tin, lead, arsenic, antimony, bismuth, selenium, tellurium, and when deposited as a constituent of an alloy, compound, oxide, etc., the elements nitrogen, phosphorous, oxygen, sulfur, mercury and gallium are operable in the process for obtaining single crystal, dendritic crystalline ribbon or other growth of the respective materials from the molten salt systems using one or more of the molten halide salts and eutectic mixtures as electrolytes, wherein the material(s) to be deposited is (are) the solute(s).

Deposition of oxides such as the ceramic high temperature superconductors can be performed with the processes of the present invention. Deposition occurs in alkali fluoride molten salt electrolytes, wherein the material(s) to be deposited is(are) the solute(s). While preferred embodiments of the present invention have been described, it is contemplated that these and other modifications and embodiments may be made by those skilled in the art, and it is therefore intended that the scope of the invention and appended claims be construed to include alternative embodiments of the invention, except insofar as it may be limited by the prior art.

What is claimed is:

1. A process for electrolytically producing elemental free-standing single crystals and free-standing dendritic crystalline materials chosen from the group consisting of: beryllium, magnesium, calcium, strontium, barium, scandium, yttrium, lanthanum, actinium, titanium, zirconium, hafnium, vanadium, niobium, tantalum, chromium, molybdenum, tungsten, manganese, technetium, rhenium, iron, ruthenium, osmium, cobalt, rhodium, iridium, nickel, palladium, platinum, copper, silver, gold, zinc, cadmium, boron, aluminum, indium, thallium, carbon, tin, lead, arsenic, antimony, bismuth, selenium and tellurium, by performing the steps of:

forming a solvent molten salt bath such as a single alkali halide salt or a eutectic metal halide mixture capable of supporting high solubilities for cations of the to-be-deposited material with molten salt bath melting point less than the melting point of the material to be produced as a single crystal;

purifying the solvent eutectic metal halide molten salt bath with appropriate oxygen removal and purification treatments such as: electropurification, addition of free metal, and bubbling of gases such as HF, HCl, HBr, HI, and H2 under vacuum;

dissolving a metal halide salt composed of the to-be-deposited metal and appropriate halide ion(s) as the solute in the molten salt bath in order to provide sufficient bulk-replenishing concentration (activity) of the cations of the material to be deposited as a crystal upon passage of electrical current;

purifying the electrolytic bath containing the to-be-deposited cations through electropurification where current is passed from a high purity sacrificial anode of the material to be deposited to a cathode operated at potentials slightly more negative than the cathodic surface potential used in production of the to-be-produced material;

immersing a cathode and an anode into said bath, said cathode being shaped in a manner to be capable of providing for nucleation of the cations on the tip of the pointed cathode, and said anode shaped to substantially replicate the crystallographic morphology desired;

application of an electrical voltage between the anode and the cathode, with applied cathodic potentials more negative than the reduction potential of the cations of the to-be-produced material, yet above the critical overpotential (cathode driving negative) for the composition of the bath; and reduction of the cations of the material to be deposited at the cathode by the passage of said electrical current to thereby form a crystalline metal deposit at the cathode.

2. A process for electrolytically producing elemental free-standing single crystals and free-standing dendritic crystalline materials chosen from the group consisting of silicon and germanium by performing the steps of:

forming a solvent molten salt bath, a eutectic metal halide mixture capable of supporting high solubilities for cations of the to-be-deposited material and a molten salt bath melting point less than the melting point of the material to be produced as a single crystal;

purifying the solvent eutectic metal halide molten salt bath with appropriate electropurification, addition of free metal, and bubbling of gases such as HF, HCl, HBr, HI, and H2 under vacuum;

dissolving a metal halide salt composed of the to-be-deposited metal and appropriate halide ion(s) as the solute in the molten salt bath in order to provide sufficient bulk-replenishing concentration (activity) of the cations of the material to be deposited as a crystal upon passage of electrical current;

purifying the electrolytic bath containing the to-be-deposited cations through electropurification where current is passed from a high purity sacrificial anode of the material to-be-deposited to a cathode operated at potentials slightly more negative than the cathodic surface potential used in production of the to-beproduced material;

immersing a cathode and an anode into said bath, said cathode being shaped in a manner to be capable of providing for nucleation of the cations on the tip of the pointed cathode and said anode shaped to substantially replicate the crystallographic morphology desired;

application of an electrical voltage between the anode and the cathode, with applied cathodic potentials more negative than the reduction potential of the cations of the to-be-produced material, yet above the critical overpotential (cathode driving negative) for the composition of the bath; and reduction of the cations of the material to be deposited at the cathode by the passage of said electrical current to thereby form a crystalline metal deposit at the cathode.

3. The invention as defined in claim 1 wherein the material is one or more of the following group: beryllium, magnesium calcium, strontium, barium, boron, and carbon, and wherein the molten salt bath is composed of group IA elements (Li, Na, K, Rb, Cs) and the halides of group VIIA (F, Cl, Br, I) in mixtures such as baths: 1, 4, 6, 7, 9, 12, 13, 15, 19, 22, 28-30, 35, 39, 41, 42, 45, 46, 48, 51, 53-56, 61, 62, 67-69, 71, 74, 77, 78, 86-88, 90-92, 97-105 in the case of beryllium or baths: 39, 41-43, 45, 46, 48, 51, 54, 61, 66-69, 71, 74, 75, 77, 80, 81, 86, 88, 90-92, 95, 98, 99, 101 in the case of magnesium or baths: 7, 10, 11, 12, 13, 15, 19, 22, 28-30, 35, 39, 41, 42, 45-48, 51, 54, 57, 60, 61, 67-71, 74, 77, 86, 88, 90-92, 98, 99, 101 in the case of calcium or baths: 15, 19, 22, 28=30, 34, 35, 39-41, 42, 45, 46, 48, 51, 52, 54, 61, 67-69, 71, 74, 77, 86, 88, 90-92, 98, 99, 101 in the case of strontium or baths: 22, 28-30, 35, 39, 41, 42, 44-46, 48, 51, 53-56, 59, 61, 62, 67-69, 71, 74, 77, 78, 86-88, 90-92, 97-105 in the case of barium or baths: 1, 4, 6, 7, 9, 12, 13, 15, 19, 22, 28-30, 35, 39, 41, 42, 45, 46, 48, 51, 53-56, 61, 62, 67-69, 71, 74, 77, 78, 84, 86-88, 90-92, 97-105, 140 in the case of boron or baths: 1, 4, 6, 7, 9, 12, 13, 15, 19, 22, 28-30, 35, 39, 41, 42, 45, 46, 48, 51, 53-56, 61, 62, 67-69, 71, 74, 77, 78, 86-88, 90-92, 97-105 in the case of carbon, or in other proportions.

4. The invention as defined in claim 2 wherein the material is one or more of the following group: silicon and germanium, and wherein the molten salt bath is composed of group IA elements (Li, Na, K, Rb, Cs) and the halides or group VIIA (CI, Br, I) in mixtures such as baths: 1, 4, 6, 7, 9, 12, 13, 15, 19, 22, 28-30, 35, 39, 41, 42, 45, 46, 48, 51, 53-56, 62, 67-69, 71, 74, 77, 78, 86-88, 90-92, 97-105, and baths: 4, 6, 7, 9, 12, 13, 15, 19, 22, 28-30, 35, 39, 41, 42, 45, 46, 48, 51, 53-56, 62, 67-69, 71, 74, 77, 78, 86-88, 90-92, 97-105 in the case of germanium.

5. The invention as defined in claim 1, wherein the material is one or more of the following group: scandium, yttrium, lanthanum, actinium, titanium, hafnium, vanadium, niobium, tantalum, chromium, molybdenum, tungsten, manganese, technetium, and wherein the molten salt bath is composed of group IA elements (Li, Na, K, Rb, Cs), group IIA elements (Be, Mg, Ca, Sr, Ba), and the halides or group VIIA (F, Cl, Br, I) in mixtures such as baths: 1–48, 51–57, 59–62, 64, 66–71, 74, 75, 77, 78, 80, 81, 86–88, 90–92, 95, 97–105, and baths: 3–48, 51–57, 59–62, 64, 66–71, 74, 75, 77, 78, 80, 81, 86–88, 90–92, 95, 97–105 in the case of lanthanum or in other proportions.

6. The invention as defined in claim 1, wherein the material is one or more of the following group: zirconium and zinc, and wherein the molten salt bath is composed of group IA elements (Li, Na, K, Rb, Cs), group IIA elements (Be, Mg, Ca, Br, Ba), zirconium (Zr), and the halides or group VIIA (F, Cl, Br, I) in mixtures such as baths: 1–48, 51–57, 59–62, 64–83, 86–92, 94, 95, 97–105 in the case of zirconium or baths: 78–83, 86–92, 94, 95, 97–105 in the case of zinc or in other proportions.

7. The invention as defined in claim 1, wherein the material is one or more of the following group: rhenium, iron, ruthenium, osmium, cobalt, rhodium, iridium, nickel, palladium, platinum, copper, silver, gold, aluminum, arsenic, antimony, and tellurium, and wherein the molten salt bath is composed of group IA elements (Li, Na, K, Rb, Cs), group IIA elements (Be, Mg, Ca, Sr, Ba), zirconium (Zr), group IIIA element aluminum (Al), and the halides or group VIIA (F, Cl, Br, I) in mixtures such as baths: 1–146 or baths: 3–146 in the case of silver or baths: 36–146 in the case of aluminum or baths: 7–146 in the case of arsenic or baths: 44–146 in the case of antimony or baths: 68–146 in the case of tellurium or in other proportions.

8. The invention as defined in claim 1, wherein the material is one or more of the following group: cadmium, thallium, and lead, and wherein the molten salt bath is composed of group IA elements (Li, Na, K, Rb, Cs), group IIA element (Be), group IIIA element aluminum (Al) (aluminum must be excluded from cadmium baths containing iodide and from thallium baths containing bromide and(or) iodide), and the halides or group VIIA (F, Cl, Br, I) in mixtures such as baths: 100–107, 112–115, 118–120, 122, 124, 125, 127, 128, 30–139, 141, and mixtures of 119 and 141 in the case of cadmium or baths: 103–105, 107, 114, 118–120, 122, 124, 125, 127, 134, 135, 138, 139, 141 and mixtures of 119 and 141 in the case of thallium or baths: 98–120, 122–141, and mixtures of 119 and 141 in the case of lead or in other proportions.

9. The invention as defined in claim 1, wherein the material is one or more of the following group: indium, tin, bismuth, and selenium, and wherein the molten salt bath is composed of group IA elements (Li, Na, K, Rb, Cs), group IIIA element aluminum (Al), and the halides or group VIIA (F, Cl, Br, I) in mixtures such as baths: 118–120, 122–141, and mixtures of 119 and 141 in the case of indium or baths: 110–146 in the case of tin or baths: 107–120, 122–141, and mixtures of 119 and 141 in the case of bismuth or baths: 111–120, 122–141, and mixtures of 119 and 141 in the case of selenium or in other proportions.

10. The invention as defined in claims 1 or 2, wherein the bath is substantially saturated with cations of the material to be electrolytically produced.

11. The invention as defined in claims 1 or 2, wherein the anode is constructed of the material to be electrolytically produced.

12. The invention as defined in claim 1 or 2, wherein the anode has a larger surface area than that of the cathode.

13. The invention as defined in claim 1 or 2, wherein an electric potential is applied between the anode and th cathode, with applied cathodic potentials slightly more negative than the cathodic surface potential used to produce the desired crystalline materials of the to-be-produced material, inducing a current flow between the anode to the cathode through the bath to remove cation impurities from the bath.

14. The invention as defined in claim 1 or 2, wherein a portion of the anode is V-shaped and the cathode is immersed in the bath substantially intermediate the legs of said V-shaped portion of said anode.

15. The invention as defined in claims 1 or 2 or 14, wherein the V-shaped portion of the anode forms an angle which coincides substantially with the crysta lographic angle of the material to be electrolytically produced to provide a shaped electric field between the anode and cathode which enhances or reinforces desired crystalline growth.

16. The invention as defined in claim 1 or 2, wherein a portion of the anode is shaped (cubic, tetragonal, pyramidal, octahedral, hexagonal, rhombohedral, trigonal, orthorhombic, and pentagonal) in such a way as to substantially replicate the morphological shape or habit of the desired crystalline material to be produced and the cathode is immersed in the bath such that the tip of the cathode is substantially positioned at a central location within the shaped field of the anode.

17. The invention as defined in claims 1 or 2 or 16, wherein the shaped (cubic, tetragonal, pyramidal, octahedral, hexagonal, rhombohedral, trigonal, orthorhombic, and pentagonal) portion of the anode coincides substantially with the crystallographic morphological shape of the material to be electrolytically produced to provide a shaped electric field between the anode and cathode which enhances or reinforces desired crystalline growth.

* * * * *